(12) United States Patent
Li et al.

(10) Patent No.: US 11,522,633 B2
(45) Date of Patent: Dec. 6, 2022

(54) DATA COMMUNICATION PROCESSING METHOD AND DEVICE

(71) Applicant: ZTE Corporation, Guangdong (CN)

(72) Inventors: Liguang Li, Shenzhen (CN); Jun Xu, Shenzhen (CN); Zhisong Zuo, Shenzhen (CN); Hao Wu, Shenzhen (CN); Yu Xin, Shenzhen (CN); Luanjian Bian, Shenzhen (CN); Jin Xu, Shenzhen (CN)

(73) Assignee: ZTE Corporation, Shenzhen (CN)

( * ) Notice: Subject to any disclaimer, the term of this patent is extended or adjusted under 35 U.S.C. 154(b) by 12 days.

(21) Appl. No.: 16/989,761

(22) Filed: Aug. 10, 2020

(65) Prior Publication Data

US 2021/0050930 A1 Feb. 18, 2021

Related U.S. Application Data

(63) Continuation of application No. PCT/CN2019/074813, filed on Feb. 15, 2019.

(30) Foreign Application Priority Data

Feb. 12, 2018 (CN) .................. 201810147596.6

(51) Int. Cl.
*H04L 1/00* (2006.01)
*H04W 28/06* (2009.01)

(52) U.S. Cl.
CPC .......... *H04L 1/0003* (2013.01); *H04L 1/0009* (2013.01); *H04L 1/0016* (2013.01); *H04W 28/06* (2013.01)

(58) Field of Classification Search
CPC ... H04L 1/0003; H04L 1/0009; H04L 1/0016; H04W 28/06
See application file for complete search history.

(56) References Cited

FOREIGN PATENT DOCUMENTS

| CN | 104243086 A | 12/2014 |
| CN | 104753633 A | 7/2015 |
| CN | 106464428 A | 2/2017 |
| WO | WO-2017/133536 A1 | 8/2017 |

OTHER PUBLICATIONS

ETSI TS 138 214 5G NR; Physical layer procedures for data (3GPP TS 38.214) ETSI TS 138 214 V15.2.0 (Jun. 2018).*

(Continued)

*Primary Examiner* — Kevin C. Harper
(74) *Attorney, Agent, or Firm* — Foley & Lardner LLP

(57) ABSTRACT

Provided are a data communication processing method and device. The method includes: acquiring a modulation order and a target code rate; calculating an intermediate number $N_{info}$ of information bits at least according to a total number of resource elements, the modulation order and the target code rate; quantizing the intermediate number $N_{info}$ of the information bits to obtain the quantized intermediate number $N'_{info}$; determining a transport block size (TBS) according to the quantized intermediate number $N'_{info}$.

12 Claims, 5 Drawing Sheets

(56) References Cited

OTHER PUBLICATIONS

3GPP TSG RAN WGI Meeting AH-1801 .4.1 MediaTek Inc. on TBS determination procedure; Jan. 2018.*
Hua Wei et al.: "MCS/CQI Design for URLLC Transmission" 3GPP TSG RAN WGI Ad Hoc Meeting RI-1800059; Jan. 13, 2018 (Jan. 13, 2018), Vancouver, Canada (7 Pages).
International Search Report for PCT Appl. No. PCT/CN2019/074813 dated Apr. 18, 2019 (with English translation, 5 pages).
Mediatek Inc.: "On TBS Determination Procedure" 3GPP TSG RAN WGI Meeting AH-1801 R1-1800170, Jan. 13, 2018 (Jan. 13, 2018), Vancouver, Canada (10 Pages).
First Office Action for CN Appl. No. 2021103555717, dated Jul. 25, 2022 (with English translation, 10 pages).

* cited by examiner

DATA COMMUNICATION PROCESSING METHOD AND DEVICE

CROSS-REFERENCE TO RELATED APPLICATIONS

The present disclosure claims the benefit of priority under 35 U.S.C. § 120 as a continuation of PCT Application No. PCT/CN2019/074813, filed on Feb. 12, 2019, which claims priority to Chinese patent application No. 201810147596.6 filed on Feb. 12, 2018, the disclosure of which are incorporated herein by reference in their entirety.

The present disclosure claims priority to Chinese patent application No. 201810147596.6 filed at the CNIPA on February 12, 18, disclosure of which is incorporated herein by reference in its entirety.

TECHNICAL FIELD

The present disclosure relates to the field of communications, for example, to a data communication processing method and device.

BACKGROUND

In a mobile communication system, due to the time-varying characteristic of a wireless fading channel, a lot of uncertainties exist in the communication process. On one hand, to improve a system throughput, high-order modulation with a higher transmission rate and error correction codes having a less redundancy are used for communication. In this way, the system throughput has been greatly improved when the signal-to-noise ratio of the wireless fading channel is ideal, but when the channel is in deep fading, it cannot ensure that the communication is reliable and stable. On the other hand, in order to ensure the reliability of the communication, low-order modulation with a lower transmission rate and error correction codes having a large redundancy are used for communication. That is, when the wireless channel is in deep fading, a reliable communication is performed. However, when the channel has a high signal-to-noise ratio, due to a relative low transmission rate, the improvement to the system throughput is restricted.

In a long term evolution (LTE) system, in order to achieve the adaptive modulation coding technology, uplink transmission control information mainly includes control signaling such as channel state information (CSI). The CSI includes a channel quality indication (CQI), a pre-coding matrix indication (PMI) and a rank indicator (RI). The CSI reflects a downlink physical channel state. The base station uses the CSI for downlink scheduling and data encoding and modulation. The CSI feedback may be fedback periodically or non-periodically.

CQI is an indicator for measuring quality of a downlink channel. In a 3GPP TS 36.213 protocol, the CQI is represented by an integer value from 0 to 15, which represent different CQI levels respectively. The CQI levels selected by a user equipment (UE) should ensure that a block error ratio (BLER, which is also called block error probability) of a transport block (TB) of a physical downlink shared channel (PDSCH) or a physical uplink shared channel (PUSCH) corresponding to the CQI under a corresponding modulation and coding scheme (MCS) does not exceed 0.1.

The CQI table generally includes quadrature amplitude modulation (QAM), and quadrature phase shift keying (QPSK) is a digital modulation method, where a modulation order corresponding to the modulation method of QPSK is 2, a modulation order corresponding to 16QAM is 4, a modulation order corresponding to 64QAM is 6, and a modulation order corresponding to 256QAM is 8.

In the LTE, except differential CQI, the CQI is represented by 4 bits. The CQI bits are reported by being included in uplink control information (UCI). The base station performs scheduling in conjunction with the CQI reported by the terminal, and determines a downlink MCS index and resource allocation information. LTE protocol in Rel-8 defines a modulation and TBS table (which also refers to MCS table hereinafter). The MCS table has 32 levels, basically each level corresponds to an MCS index, and each MCS index essentially corresponds to a type of MCS (a set of modulation orders and encoding rates or a type of spectral efficiency). Resource allocation information provides the number of physical resource blocks (NPRB) needed to be occupied by downlink transmission.

After receiving data of the downlink transmission, the terminal needs to acquire the MCS index and transport block size (TBS) for data demodulation and decoding of the downlink transmission. The base station sends downlink control information in a specific downlink control information (DCI) format in a physical downlink control channel (PDCCH), including a 5-bit MCS index and a resource allocation position. After the terminal obtains the TBS according to a TBS table after acquiring the downlink control information, and the TBS is used for demodulation and decoding.

In an ultra reliable and low latency communication (URLLC) communication scenario, the communication is required to be high reliability and low latency communication, then data communication must perform the ultra high reliability in a very short period of time, and signaling needs to be compressed, etc., so that the signaling is more concise and efficient. However, the MCS table of the current LTE or new radio (NR) may not meet the system requirement of the URLLC communication.

And in the communication process, it is necessary to determine TBS information at both the transmitting end and the receiving end. In the current NR communication protocol, a TBS calculated at a higher MCS level leads to the actual effective code rate being greater than 0.95, so that a receiving end cannot correctly decode transport block information and retransmission processing needs to be performed for decoding, a lot of system latency is brought, the communication stability are seriously affected.

In the related art, the communication system cannot effectively support the problem of low-latency and high-reliability communication, and no effective solution has been proposed yet.

SUMMARY

The present disclosure provides a data communication processing method and device to at least solve the problem that the communication system in the related art cannot effectively support low-latency and high-reliability communication.

The present disclosure provides a data communication processing method, which is applied to a communication device. The method includes: acquiring a modulation order and a target code rate; calculating an intermediate number $N_{info}$ of information bits at least according to a total number of resource elements, the modulation order and the target code rate; quantizing the intermediate number $N_{info}$ of the information bits to obtain the quantized intermediate number $N'_{info}$; determining a transport block size (TBS) according to the quantized intermediate number $N'_{info}$.

The present disclosure provides a data communication processing method, which is applied to a wireless communication node. The method includes: determining a modulation order and a target code rate; calculating an intermediate number $N_{info}$ of information bits at least according to a total number of resource elements, the modulation order and the target code rate; quantizing the intermediate number $N_{info}$ of the information bits to obtain the quantized intermediate number $N'_{info}$; and determining a transport block size (TBS) according to the quantized intermediate number $N'_{info}$.

The present disclosure provides a data communication processing device, which is applied to a base station. The device includes: a first acquisition module, which is configured to acquire a modulation order and a target code rate; a calculation module, which is configure to calculate an intermediate number $N_{info}$ of information bits at least according to a total number of resource elements, the modulation order and the target code rate; a second acquisition module, which is configured to quantize the intermediate number $N_{info}$ of the information bits to obtain the quantized intermediate number $N'_{info}$; and a determination module, which is configured to determine a transport block size (TBS) according to the quantized intermediate number $N'_{info}$.

The present disclosure provides a data communication processing device, which is applied to a base station. The device includes: a second determination module, which is configured to determine a modulation order and a target code rate; a second calculation module, which is configure to calculate an intermediate number $N_{info}$ of information bits at least according to a total number of resource elements, the modulation order and the target code rate; a third acquisition module, which is configured to quantize the intermediate number $N_{info}$ of the information bits to obtain the quantized intermediate number $N'_{info}$; and a third determination module, which is configured to determine a transport block size (TBS) according to the quantized intermediate number $N'_{info}$.

The present disclosure further provides a storage medium. The storage medium is configured to store computer programs which, when run, execute the steps of any one of the method embodiments described above.

The present disclosure further provides an electronic device, including a memory and a processor, where the memory is configured to store computer programs and the processor is configured to execute the computer programs for executing the steps in any one of the method embodiments described above.

DETAILED DESCRIPTION

The present disclosure will be described hereinafter in detail with reference to the drawings and in conjunction with embodiments.

The terms "first", "second" and the like in the description, claims and above drawings of the present disclosure are used to distinguish between similar objects and are not necessarily used to describe a particular order or sequence.

Embodiment One

Figure 1:
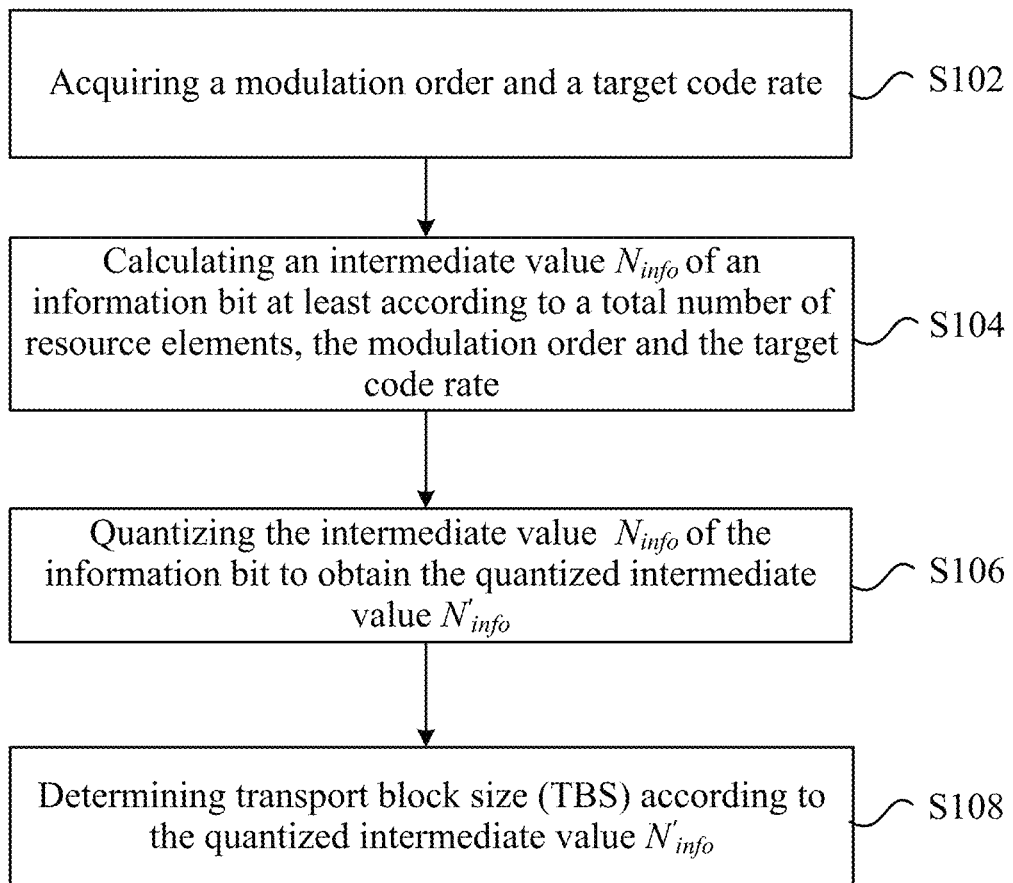
FIG. 1 is a flowchart of a data communication processing method according to an embodiment of the present disclosure.

FIG. 1 is a flowchart of a data communication processing method according to an embodiment. The method is applied to a communication device or a user equipment (UE). As shown in FIG. 1, the method includes steps S102, S104, S106 and S108 described below.

In step S102, a modulation order and a target code rate are acquired.

In step S104, an intermediate number $N_{info}$ of information bits is calculated at least according to a total number of resource elements, the modulation order and the target code rate.

In step S106, the intermediate number $N_{info}$ of the information bits is quantized to obtain the quantized intermediate number $N'_{info}$.

In step S108, a transport block size (TBS) is determined according to the quantized intermediate number $N'_{info}$.

In an embodiment, the step in which TBS is determined according to the quantized intermediate number $N'_{info}$ includes: selecting one TBS from a one-dimensional TBS table according to the quantized intermediate number $N'_{info}$.

Through the above steps S102 to S108, the modulation order and the target code rate are acquired, the intermediate number $N_{info}$ of the information bits is calculated at least according to the total number of resource elements, the modulation order and the target code rate; the intermediate number $N_{info}$ of the information bits is quantized to obtain the quantized intermediate number $N'_{info}$; and the transport block size (TBS) is determined according to the quantized intermediate number $N'_{info}$. The problem that the communication system in the related art cannot effectively support low-latency and high-reliability communication is solved, and the technical effect of low-latency and high-reliability communication between the base station and the terminal is achieved.

In an embodiment, the step in which the modulation order and the target code rate are acquired includes steps descried below.

In step S110, control information is received from a wireless communication node, where the control information at least includes: modulation and coding scheme (MCS) field information.

In step S120, the modulation order and the target code rate are determined from an MCS table according to the MCS field information.

Through the above steps S110 to S120, the problem that the TBS calculated at a higher MCS level in the related art leads to the actual effective code rate be greater than 0.95 is solved.

Figure 2:
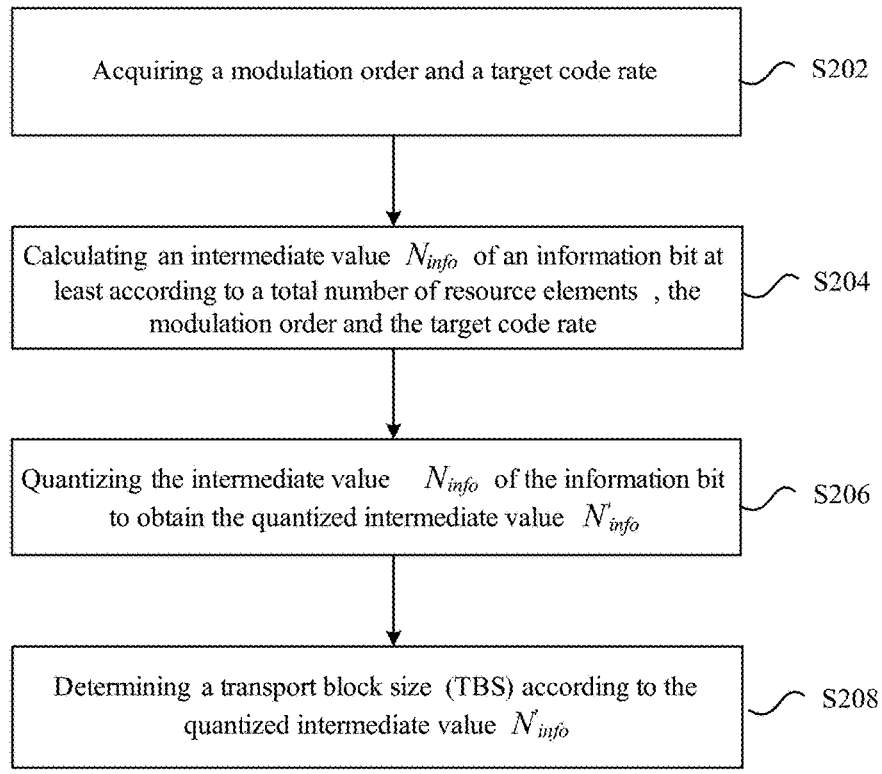
FIG. 2 is a flowchart of another data communication processing method according to an embodiment of the present disclosure.

FIG. 2 is a flowchart of another data communication processing method according to an embodiment. The method is applied to a wireless communication node (such as a base station). As shown in FIG. 2, the method includes steps S202, S204, S206 and S208 described below.

In step S202, a modulation order and a target code rate are acquired.

In step S204, an intermediate number $N_{info}$ of information bits is calculated at least according to a total number of resource elements, the modulation order and the target code rate.

In step S206, the intermediate number $N_{info}$ of the information bits is quantized to obtain the quantized intermediate number $N'_{info}$.

In step S208, a transport block size (TBS) is determined according to the quantized intermediate number $N'_{info}$.

In an embodiment, the step in which TBS is determined according to the quantized intermediate number $N'_{info}$ includes: selecting one TBS from a one-dimensional TBS table according to the quantized intermediate number $N'_{info}$.

Through the above steps S202 to S208, the modulation order and the target code rate are determined, the intermediate number $N_{info}$ of the information bits is calculated at least according to the total number of resource elements, the modulation order and the target code rate; the intermediate number $N_{info}$ of the information bits is quantized to obtain the quantized intermediate number $N'_{info}$; and the transport block size (TBS) is determined according to the quantized intermediate number $N'_{info}$. The problem that the communication system in the related art cannot effectively support low-latency and high-reliability communication is solved, and the technical effect of low-latency and high-reliability communication between the base station and the terminal is achieved.

In an embodiment, the step in which the modulation order and the target code rate are determined includes steps described below.

In step S210, control information of a communication device related to a wireless communication node is generated, where the control information at least includes: modulation and coding scheme (MCS) field information.

In step S220, the modulation order and the target code rate are determined from an MCS table according to the MCS field information.

Through the above steps S210 to S220, the problem that the TBS calculated at a higher MCS level in the related art leads to the actual effective code rate be greater than 0.95 is solved.

In an embodiment, the method further includes steps described below.

In step S310, the wireless communication node demodulates and decodes data from the communication device (or the UE) according to the TBS to obtain received data with a size of TBS; or performs low density parity check code (LDPC) encoding on information bits data of a length of TBS to obtain the encoded data, and sends the encoded data and the control information to the communication device (or the UE); or sends the control information to the communication device (or the UE).

In an embodiment, the step in which the intermediate number $N_{info}$ of the information bits is quantized to obtain the quantized intermediate number $N'_{info}$ includes: quantizing the intermediate number $N_{info}$ according to the following formula:

$$N'_{info} = \max\left(24, 2^n * \left\lfloor \frac{N_{info} - \text{Offset}}{2^n} \right\rfloor\right),$$

where the Offset is determined according to the intermediate number $N_{info}$, and $n=\max(3, \lfloor \log_2(N_{info}) \rfloor - 6)$.

In an embodiment, the step in which the intermediate number $N_{info}$ of the information bits is quantized to obtain the quantized intermediate number $N'_{info}$ includes: quantizing the intermediate number $N_{info}$ according to the following formula $$N'_{info} = \max\left(24, 2^n * \left\lfloor \frac{N_{info}}{2^n} \right\rfloor\right) - \text{Offset},$$

where the Offset is determined according to the intermediate number $N_{info}$, and $n=\max(3, \lfloor \log_2(N_{info}) \rfloor - 6)$.

In an embodiment, the Offset is equal to a positive integer times an nth power of 2, $n=\max(3, \lfloor \log_2(N_{info}) \rfloor -6)$, the positive integer is equal to 1, 2, 3, 4, 5 or 6.

In an embodiment, the step in which the intermediate number $N_{info}$ of the information bits is quantized to obtain the quantized intermediate number $N'_{info}$ includes: quantizing the intermediate number $N_{info}$ according to the following formula $$N'_{info} = \max\left(24, 2^n * \left\lfloor \frac{N_{info}}{2^n} - \alpha \right\rfloor\right) \text{ or}$$

$$N'_{info} = \max\left(24, 2^n * \left(\left\lfloor \frac{N_{info}}{2^n} \right\rfloor - \alpha\right)\right),$$

where $n=\max(3, \lfloor \log_2(N_{info}) \rfloor -6)$, $\alpha$ is equal to 1, 2, 3, 4, 5 or 6.

In an embodiment, the intermediate number $N_{info}$ of the information bits is less than or equal to a preset threshold, where the preset threshold is equal to 3824, 3816, 3840, or 3896.

In an embodiment, the above method further includes: determining the MCS table from multiple MCS tables according to higher layer signaling.

In an embodiment, the multiple MCS tables at least includes MCS table, where the one MCS table includes at least the following fields: an MCS index, a modulation order, and a target code rate; where a maximum target code rate among all MCSs having a modulation order of 1 in the one MCS table is equal to a sum of a code rate of mother code and Δa, where Δa is a real number ranges −0.08 from 0.08.

In an embodiment, the multiple MCS tables at least includes one MCS table, where the one MCS table includes at least the following fields: an MCS index, a modulation order, a target code rate and spectral efficiency; where a redundancy version corresponding to an MCS with the spectral efficiency less than Δs in the one MCS table is only RV0; and redundancy versions corresponding to an MCS with the spectral efficiency greater than Δs in the one MCS table are only RV0 and RV2; where Δs is a real number greater than 0.65 and less than 0.85.

In an embodiment, the multiple MCS tables at least includes one MCS table, where the one MCS table comprises at least the following fields: an MCS index, a modulation order, and a target code rate; where in the one MCS table, a redundancy version corresponding to an MCS in which the target code rate is less than a sum of a mother code and Δb is only RV0, where Δb is a positive real number less than or equal to 0.1.

In an embodiment, in the one MCS table, a redundancy version corresponding to an MCS in which the target code rate is greater than the sum of the mother code and Δb, and is less than a sum of twice of the code rate of the mother code and Δc includes: {RV0, RV2}, where Δb is a positive real number less than or equal to 0.1, and Δc is a positive real number less than or equal to 0.1.

In an embodiment, in the one MCS table, a redundancy version corresponding to an MCS in which the target code rate is greater than the sum of twice of the code rate of the mother code and Δc includes: {RV0, RV2, RV3}, {RV0, RV2, RV1} or {RV0, RV2, RV3, RV1}, where Δc is a positive real number less than or equal to 0.1.

In an embodiment, the code rate of mother code is equal to 0.2.

In an embodiment, the multiple MCS tables at least includes one MCS table, where in one MCS table, the number of MCS only supports RV0 is 3 or 4.

In an embodiment, the multiple MCS tables at least includes one MCS table, where in one MCS table, the number of MCS only supports RV0 and RV2 is 4 or 5.

In an embodiment, the multiple MCS tables at least includes one MCS table, where in one MCS table, a target code rate of MCS with an 0 index is 80/1024; and/or a target code rate of MCS with an 1 index is 156/1024.

In an embodiment, the multiple MCS tables at least include one MCS table, where the one MCS table includes at least the following fields: an MCS index, a modulation order, a target code rate and redundancy version number.

In an embodiment, the MCS table at least includes the following fields: the MCS index and the modulation order, the number of MCSs having a modulation order of 1 is 4, 5 and 6.

In an embodiment, the MCS table at least includes the following fields: the MCS index, the modulation order and the target code rate, the maximum target code rate of MCS having a modulation order of 1 is 198/1024 or 240/1024.

In an embodiment, the MCS table at least includes the following fields: the MCS index and the spectral efficiency, the maximum target code rate of MCS having a modulation order of 1 is 0.1934 or 0.2344.

This embodiment will be exemplarily described below in conjunction with exemplary embodiments.

In this embodiment, a data communication processing method is provided, which can be used in a new radio access technology (new RAT) communication system. The method provided in this exemplary embodiment can be applied to a Long Term Evolution (LTE) mobile communication system or a future fifth generation (5G) mobile communication system or other wireless or wired communication systems, and the data transmission direction is a direction where a base station sends data to a mobile user (downlink transmission of service data), or the data transmission direction is a direction where a mobile user sends data to a base station (uplink transmission of service data). The mobile user includes: a mobile device, an access terminal, a user terminal, a user station, a user unit, a mobile station, a remote station, a remote terminal, a user agent, a user equipment, a user device, or devices named after other terms. The base station includes: an access point (AP), which may be called a node B, a radio network controller (RNC), an evolved node B (eNB), a base station controller (BSC), a base station controller (BTS), a base station (BS), a transceiver function, a radio router, a radio transceiver, a basic service unit (BSS), an expansion service unit (ESS), a radio base station (RBS), or some other devices.

According to an aspect of this exemplary embodiment, an MCS modulation and coding processing method provided in this exemplary embodiment may be applied to a new wireless access technology communication system, and the new wireless access technology communication system includes an enhanced mobile broadband (eMBB) scenario, a URLLC scenario or a massive machine type communications (mMTC) scenario.

In an embodiment, the embodiment is a 5G new RAT application scenario, where in the above 5G communication, a data channel encoding uses quasi-cyclic LDPC encoding, and a lifting size set of the quasi-cyclic LDPC encoding is shown in Table 1, including 8 subsets and subset index numbers are 0 to 7. A base graph of a parity check matrix (PCM) in the quasi-cyclic LDPC encoding includes two types: a base graph 1 and a base graph 2. The base graph 1 of the basic graph matrix has 46 rows and 68 columns; and the base graph 2 of the basic graph matrix has 42 rows and 52 columns. Table 2 shows the basic graph matrix corresponding to the base graph 1 of the basic graph matrix and the corresponding 8 parity check matrices (PCMs), where i is used for indicating a row index and j is used for indicating a column index. Wherein $i_{LS}$ is an index number, and also corresponds to an index number of a lifting size subset, and each {i, j} combination in Table 2 determines that an i-th row and a j-th column of the base graph 1 are "1" elements. What corresponds to Table 3 is the base graph 2 of the base graph matrix and the corresponding 8 PCMs. The code rate of the mother code of the above base graph 1 is $(68-46)/(68-2)=1/3=0.3333$, and the code rate of the mother code of the above base graph 2 is $(52-42)/(52-2)=1/5=0.2$.

In the LDPC encoding process, the basic graph matrix is determined according to information packet length information and quasi-cyclic LDPC encoding rate information. For example, if the information packet length information is less than 308, or the information packet length information is less than or equal to 3840 and the quasi-cyclic LDPC encoding code rate is less than or equal to 2/3, or the LDPC encoding code rate is less than or equal to 1/4, then base graph 2 of the base graph matrix is selected; in addition to the above situation, the base graph 1 of the base graph matrix is selected. Then according to the information packet length information and system column number information kb of the basic graph matrix, a lifting size Z of the quasi-cyclic LDPC encoding is determined from the table 1, for example, one lifting size Z greater than or equal to K/kb is selected from the table 1; the corresponding index number of the lifting size subset may be acquired according to the lifting size Z, the PCM from Table 2 or Table 3 may be determined according to the index number of the lifting size subset. The basic matrix Hb corresponding to the lifting size Z may be obtained according to the formula, and the above is elements in the i-th row and j-th column of the shift value matrix; the quasi-cyclic LDPC encoding may be performed on an information group bit sequence according to the lifting size Z and the basic matrix Hb.

TABLE 1

8 subsets of the lifting size of the LDPC encoding

| Set index ($i_{LS}$) | Set of lifting sizes (Z) |
|---|---|
| 0 | {2, 4, 8, 16, 32, 64, 128, 256} |
| 1 | {3, 6, 12, 24, 48, 96, 192, 384} |
| 2 | {5, 10, 20, 40, 80, 160, 320} |

TABLE 1-continued 8 subsets of the lifting size of the LDPC encoding

| Set index ($i_{LS}$) | Set of lifting sizes (Z) |
|---|---|
| 3 | {7, 14, 28, 56, 112, 224} |
| 4 | {9, 18, 36, 72, 144, 288} |
| 5 | {11, 22, 44, 88, 176, 352} |
| 6 | {13, 26, 52, 104, 208} |
| 7 | {15, 30, 60, 120, 240} |

TABLE 2

Base graph 1 ($H_{BG}$) of LDPC encoding and corresponding PCM ($V_{i,j}$)

| $H_{BG}$ | | $V_{i,j}$ Set index $i_{LS}$ | | | | | | | |
|---|---|---|---|---|---|---|---|---|---|
| Row index i | Column index j | 0 | 1 | 2 | 3 | 4 | 5 | 6 | 7 |
| 0 | 0 | 250 | 307 | 73 | 223 | 211 | 294 | 0 | 135 |
|  | 1 | 69 | 19 | 15 | 16 | 198 | 118 | 0 | 227 |
|  | 2 | 226 | 50 | 103 | 94 | 188 | 167 | 0 | 126 |
|  | 3 | 159 | 369 | 49 | 91 | 186 | 330 | 0 | 134 |
|  | 5 | 100 | 181 | 240 | 74 | 219 | 207 | 0 | 84 |
|  | 6 | 10 | 216 | 39 | 10 | 4 | 165 | 0 | 83 |
|  | 9 | 59 | 317 | 15 | 0 | 29 | 243 | 0 | 53 |
|  | 10 | 229 | 288 | 162 | 205 | 144 | 250 | 0 | 225 |
|  | 11 | 110 | 109 | 215 | 216 | 116 | 1 | 0 | 205 |
|  | 12 | 191 | 17 | 164 | 21 | 216 | 339 | 0 | 128 |
|  | 13 | 9 | 357 | 133 | 215 | 115 | 201 | 0 | 75 |
|  | 15 | 195 | 215 | 298 | 14 | 233 | 53 | 0 | 135 |
|  | 16 | 23 | 106 | 110 | 70 | 144 | 347 | 0 | 217 |
|  | 18 | 190 | 242 | 113 | 141 | 95 | 304 | 0 | 220 |
|  | 19 | 35 | 180 | 16 | 198 | 216 | 167 | 0 | 90 |
|  | 20 | 239 | 330 | 189 | 104 | 73 | 47 | 0 | 105 |
|  | 21 | 31 | 346 | 32 | 81 | 261 | 188 | 0 | 137 |
|  | 22 | 1 | 1 | 1 | 1 | 1 | 1 | 0 | 1 |
|  | 23 | 0 | 0 | 0 | 0 | 0 | 0 | 0 | 0 |
| 1 | 0 | 2 | 76 | 303 | 141 | 179 | 77 | 22 | 96 |
|  | 2 | 239 | 76 | 294 | 45 | 162 | 225 | 11 | 236 |
|  | 3 | 117 | 73 | 27 | 151 | 223 | 96 | 124 | 136 |
|  | 4 | 124 | 288 | 261 | 46 | 256 | 338 | 0 | 221 |
|  | 5 | 71 | 144 | 161 | 119 | 160 | 268 | 10 | 128 |
|  | 7 | 222 | 331 | 133 | 157 | 76 | 112 | 0 | 92 |
|  | 8 | 104 | 331 | 4 | 133 | 202 | 302 | 0 | 172 |
|  | 9 | 173 | 178 | 80 | 87 | 117 | 50 | 2 | 56 |
|  | 11 | 220 | 295 | 129 | 206 | 109 | 167 | 16 | 11 |
|  | 12 | 102 | 342 | 300 | 93 | 15 | 253 | 60 | 189 |
|  | 14 | 109 | 217 | 76 | 79 | 72 | 334 | 0 | 95 |
|  | 15 | 132 | 99 | 266 | 9 | 152 | 242 | 6 | 85 |
|  | 16 | 142 | 354 | 72 | 118 | 158 | 257 | 30 | 153 |
|  | 17 | 155 | 114 | 83 | 194 | 147 | 133 | 0 | 87 |
|  | 19 | 255 | 331 | 260 | 31 | 156 | 9 | 168 | 163 |
|  | 21 | 28 | 112 | 301 | 187 | 119 | 302 | 31 | 216 |
|  | 22 | 0 | 0 | 0 | 0 | 0 | 0 | 105 | 0 |
|  | 23 | 0 | 0 | 0 | 0 | 0 | 0 | 0 | 0 |
|  | 24 | 0 | 0 | 0 | 0 | 0 | 0 | 0 | 0 |
| 2 | 0 | 106 | 205 | 68 | 207 | 258 | 226 | 132 | 189 |
|  | 1 | 111 | 250 | 7 | 203 | 167 | 35 | 37 | 4 |
|  | 2 | 185 | 328 | 80 | 31 | 220 | 213 | 21 | 225 |
|  | 4 | 63 | 332 | 280 | 176 | 133 | 302 | 180 | 151 |
|  | 5 | 117 | 256 | 38 | 180 | 243 | 111 | 4 | 236 |
|  | 6 | 93 | 161 | 227 | 186 | 202 | 265 | 149 | 117 |
|  | 7 | 229 | 267 | 202 | 95 | 218 | 128 | 48 | 179 |
|  | 8 | 177 | 160 | 200 | 153 | 63 | 237 | 38 | 92 |
|  | 9 | 95 | 63 | 71 | 177 | 0 | 294 | 122 | 24 |
|  | 10 | 39 | 129 | 106 | 70 | 3 | 127 | 195 | 68 |
|  | 13 | 142 | 200 | 295 | 77 | 74 | 110 | 155 | 6 |
|  | 14 | 225 | 88 | 283 | 214 | 229 | 286 | 28 | 101 |
|  | 15 | 225 | 53 | 301 | 77 | 0 | 125 | 85 | 33 |
|  | 17 | 245 | 131 | 184 | 198 | 216 | 131 | 47 | 96 |
|  | 18 | 205 | 240 | 246 | 117 | 269 | 163 | 179 | 125 |
|  | 19 | 251 | 205 | 230 | 223 | 200 | 210 | 42 | 67 |
|  | 20 | 117 | 13 | 276 | 90 | 234 | 7 | 66 | 230 |
|  | 24 | 0 | 0 | 0 | 0 | 0 | 0 | 0 | 0 |

TABLE 2-continued

Base graph 1 ($H_{BG}$) of LDPC encoding and corresponding PCM ($V_{i,j}$)

| $H_{BG}$ | | $V_{i,j}$ Set index $i_{LS}$ | | | | | | | |
|---|---|---|---|---|---|---|---|---|---|
| Row index i | Column index j | 0 | 1 | 2 | 3 | 4 | 5 | 6 | 7 |
|  | 25 | 0 | 0 | 0 | 0 | 0 | 0 | 0 | 0 |
| 3 | 0 | 121 | 276 | 220 | 201 | 187 | 97 | 4 | 128 |
|  | 1 | 89 | 87 | 208 | 18 | 145 | 94 | 6 | 23 |
|  | 3 | 84 | 0 | 30 | 165 | 166 | 49 | 33 | 162 |
|  | 4 | 20 | 275 | 197 | 5 | 108 | 279 | 113 | 220 |
|  | 6 | 150 | 199 | 61 | 45 | 82 | 139 | 49 | 43 |
|  | 7 | 131 | 153 | 175 | 142 | 132 | 166 | 21 | 186 |
|  | 8 | 243 | 56 | 79 | 16 | 197 | 91 | 6 | 96 |
|  | 10 | 136 | 132 | 281 | 34 | 41 | 106 | 151 | 1 |
|  | 11 | 86 | 305 | 303 | 155 | 162 | 246 | 83 | 216 |
|  | 12 | 246 | 231 | 253 | 213 | 57 | 345 | 154 | 22 |
|  | 13 | 219 | 341 | 164 | 147 | 36 | 269 | 87 | 24 |
|  | 14 | 211 | 212 | 53 | 69 | 115 | 185 | 5 | 167 |
|  | 16 | 240 | 304 | 44 | 96 | 242 | 249 | 92 | 200 |
|  | 17 | 76 | 300 | 28 | 74 | 165 | 215 | 173 | 32 |
|  | 18 | 244 | 271 | 77 | 99 | 0 | 143 | 120 | 235 |
|  | 20 | 144 | 39 | 319 | 30 | 113 | 121 | 2 | 172 |
|  | 21 | 12 | 357 | 68 | 158 | 108 | 121 | 142 | 219 |
|  | 22 | 1 | 1 | 1 | 1 | 1 | 1 | 0 | 1 |
|  | 25 | 0 | 0 | 0 | 0 | 0 | 0 | 0 | 0 |
| 4 | 0 | 157 | 332 | 233 | 170 | 246 | 42 | 24 | 64 |
|  | 1 | 102 | 181 | 205 | 10 | 235 | 256 | 204 | 211 |
|  | 26 | 0 | 0 | 0 | 0 | 0 | 0 | 0 | 0 |
| 5 | 0 | 205 | 195 | 83 | 164 | 261 | 219 | 185 | 2 |
|  | 1 | 236 | 14 | 292 | 59 | 181 | 130 | 100 | 171 |
|  | 3 | 194 | 115 | 50 | 86 | 72 | 251 | 24 | 47 |
|  | 12 | 231 | 166 | 318 | 80 | 283 | 322 | 65 | 143 |
|  | 16 | 28 | 241 | 201 | 182 | 254 | 295 | 207 | 210 |
|  | 21 | 123 | 51 | 267 | 130 | 79 | 258 | 161 | 180 |
|  | 22 | 115 | 157 | 279 | 153 | 144 | 283 | 72 | 180 |
|  | 27 | 0 | 0 | 0 | 0 | 0 | 0 | 0 | 0 |
| 6 | 0 | 183 | 278 | 289 | 158 | 80 | 294 | 6 | 199 |
|  | 6 | 22 | 257 | 21 | 119 | 144 | 73 | 27 | 22 |
|  | 10 | 28 | 1 | 293 | 113 | 169 | 330 | 163 | 23 |
|  | 11 | 67 | 351 | 13 | 21 | 90 | 99 | 50 | 100 |
|  | 13 | 244 | 92 | 232 | 63 | 59 | 172 | 48 | 92 |
|  | 17 | 11 | 253 | 302 | 51 | 177 | 150 | 24 | 207 |
|  | 18 | 157 | 18 | 138 | 136 | 151 | 284 | 38 | 52 |
|  | 20 | 211 | 225 | 235 | 116 | 108 | 305 | 91 | 13 |
|  | 28 | 0 | 0 | 0 | 0 | 0 | 0 | 0 | 0 |
| 7 | 0 | 220 | 9 | 12 | 17 | 169 | 3 | 145 | 77 |
|  | 1 | 44 | 62 | 88 | 76 | 189 | 103 | 88 | 146 |
|  | 4 | 159 | 316 | 207 | 104 | 154 | 224 | 112 | 209 |
|  | 7 | 31 | 333 | 50 | 100 | 184 | 297 | 153 | 32 |
|  | 8 | 167 | 290 | 25 | 150 | 104 | 215 | 159 | 166 |
|  | 14 | 104 | 114 | 76 | 158 | 164 | 39 | 76 | 18 |
|  | 29 | 0 | 0 | 0 | 0 | 0 | 0 | 0 | 0 |
| 8 | 0 | 112 | 307 | 295 | 33 | 54 | 348 | 172 | 181 |
|  | 1 | 4 | 179 | 133 | 95 | 0 | 75 | 2 | 105 |
|  | 3 | 7 | 165 | 130 | 4 | 252 | 22 | 131 | 141 |
|  | 12 | 211 | 18 | 231 | 217 | 41 | 312 | 141 | 223 |
|  | 16 | 102 | 39 | 296 | 204 | 98 | 224 | 96 | 177 |
|  | 19 | 164 | 224 | 110 | 39 | 46 | 17 | 99 | 145 |
|  | 21 | 109 | 368 | 269 | 58 | 15 | 59 | 101 | 199 |
|  | 22 | 241 | 67 | 245 | 44 | 230 | 314 | 35 | 153 |
|  | 24 | 90 | 170 | 154 | 201 | 54 | 244 | 116 | 38 |
|  | 30 | 0 | 0 | 0 | 0 | 0 | 0 | 0 | 0 |
| 9 | 0 | 103 | 366 | 189 | 9 | 162 | 156 | 6 | 169 |
|  | 1 | 182 | 232 | 244 | 37 | 159 | 88 | 10 | 12 |
|  | 10 | 109 | 321 | 36 | 213 | 93 | 293 | 145 | 206 |
|  | 11 | 21 | 133 | 286 | 105 | 134 | 111 | 53 | 221 |
|  | 13 | 142 | 57 | 151 | 89 | 45 | 92 | 201 | 17 |
|  | 17 | 14 | 303 | 267 | 185 | 132 | 152 | 4 | 212 |
|  | 18 | 61 | 63 | 135 | 109 | 76 | 23 | 164 | 92 |
|  | 20 | 216 | 82 | 209 | 218 | 209 | 337 | 173 | 205 |
|  | 31 | 0 | 0 | 0 | 0 | 0 | 0 | 0 | 0 |
| 10 | 1 | 98 | 101 | 14 | 82 | 178 | 175 | 126 | 116 |
|  | 2 | 149 | 339 | 80 | 165 | 1 | 253 | 77 | 151 |
|  | 4 | 167 | 274 | 211 | 174 | 28 | 27 | 156 | 70 |
|  | 7 | 160 | 111 | 75 | 19 | 267 | 231 | 16 | 230 |
|  | 8 | 49 | 383 | 161 | 194 | 234 | 49 | 12 | 115 |

TABLE 2-continued

Base graph 1 ($H_{BG}$) of LDPC encoding and corresponding PCM ($V_{i,j}$)

| $H_{BG}$ Row index i | $H_{BG}$ Column index j | $V_{i,j}$ Set index $i_{LS}$ 0 | 1 | 2 | 3 | 4 | 5 | 6 | 7 |
|---|---|---|---|---|---|---|---|---|---|
| | 14 | 58 | 354 | 311 | 103 | 201 | 267 | 70 | 84 |
| | 32 | 0 | 0 | 0 | 0 | 0 | 0 | 0 | 0 |
| 11 | 0 | 77 | 48 | 16 | 52 | 55 | 25 | 184 | 45 |
| | 1 | 41 | 102 | 147 | 11 | 23 | 322 | 194 | 115 |
| | 12 | 83 | 8 | 290 | 2 | 274 | 200 | 123 | 134 |
| | 16 | 182 | 47 | 289 | 35 | 181 | 351 | 16 | 1 |
| | 21 | 78 | 188 | 177 | 32 | 273 | 166 | 104 | 152 |
| | 22 | 252 | 334 | 43 | 84 | 39 | 338 | 109 | 165 |
| | 23 | 22 | 115 | 280 | 201 | 26 | 192 | 124 | 107 |
| | 33 | 0 | 0 | 0 | 0 | 0 | 0 | 0 | 0 |
| 12 | 0 | 160 | 77 | 229 | 142 | 225 | 123 | 6 | 186 |
| | 1 | 42 | 186 | 235 | 175 | 162 | 217 | 20 | 215 |
| | 10 | 21 | 174 | 169 | 136 | 244 | 142 | 203 | 124 |
| | 11 | 32 | 232 | 48 | 3 | 151 | 110 | 153 | 180 |
| | 13 | 234 | 50 | 105 | 28 | 238 | 176 | 104 | 98 |
| | 18 | 7 | 74 | 52 | 182 | 243 | 76 | 207 | 80 |
| | 34 | 0 | 0 | 0 | 0 | 0 | 0 | 0 | 0 |
| 13 | 0 | 177 | 313 | 39 | 81 | 231 | 311 | 52 | 220 |
| | 3 | 248 | 177 | 302 | 56 | 0 | 251 | 147 | 185 |
| | 7 | 151 | 266 | 303 | 72 | 216 | 265 | 1 | 154 |
| | 20 | 185 | 115 | 160 | 217 | 47 | 94 | 16 | 178 |
| | 23 | 62 | 370 | 37 | 78 | 36 | 81 | 46 | 150 |
| | 35 | 0 | 0 | 0 | 0 | 0 | 0 | 0 | 0 |
| 14 | 0 | 206 | 142 | 78 | 14 | 0 | 22 | 1 | 124 |
| | 12 | 55 | 248 | 299 | 175 | 186 | 322 | 202 | 144 |
| | 15 | 206 | 137 | 54 | 211 | 253 | 277 | 118 | 182 |
| | 16 | 127 | 89 | 61 | 191 | 16 | 156 | 130 | 95 |
| | 17 | 16 | 347 | 179 | 51 | 0 | 66 | 1 | 72 |
| | 21 | 229 | 12 | 258 | 43 | 79 | 78 | 2 | 76 |
| | 36 | 0 | 0 | 0 | 0 | 0 | 0 | 0 | 0 |
| 15 | 0 | 40 | 241 | 229 | 90 | 170 | 176 | 173 | 39 |
| 15 | 1 | 96 | 2 | 290 | 120 | 0 | 348 | 6 | 138 |
| | 10 | 65 | 210 | 60 | 131 | 183 | 15 | 81 | 220 |
| | 13 | 63 | 318 | 130 | 209 | 108 | 81 | 182 | 173 |
| | 18 | 75 | 55 | 184 | 209 | 68 | 176 | 53 | 142 |
| | 25 | 179 | 269 | 51 | 81 | 64 | 113 | 46 | 49 |
| | 37 | 0 | 0 | 0 | 0 | 0 | 0 | 0 | 0 |
| 16 | 1 | 64 | 13 | 69 | 154 | 270 | 190 | 88 | 78 |
| | 3 | 49 | 338 | 140 | 164 | 13 | 293 | 198 | 152 |
| | 11 | 49 | 57 | 45 | 43 | 99 | 332 | 160 | 84 |
| | 20 | 51 | 289 | 115 | 189 | 54 | 331 | 122 | 5 |
| | 22 | 154 | 57 | 300 | 101 | 0 | 114 | 182 | 205 |
| | 38 | 0 | 0 | 0 | 0 | 0 | 0 | 0 | 0 |
| 17 | 0 | 7 | 260 | 257 | 56 | 153 | 110 | 91 | 183 |
| | 14 | 164 | 303 | 147 | 110 | 137 | 228 | 184 | 112 |
| | 16 | 59 | 81 | 128 | 200 | 0 | 247 | 30 | 106 |
| | 17 | 1 | 358 | 51 | 63 | 0 | 116 | 3 | 219 |
| | 21 | 144 | 375 | 228 | 4 | 162 | 190 | 155 | 129 |
| | 39 | 0 | 0 | 0 | 0 | 0 | 0 | 0 | 0 |
| 18 | 1 | 42 | 130 | 260 | 199 | 161 | 47 | 1 | 183 |
| | 12 | 233 | 163 | 294 | 110 | 151 | 286 | 41 | 215 |
| | 13 | 8 | 280 | 291 | 200 | 0 | 246 | 167 | 180 |
| | 18 | 155 | 132 | 141 | 143 | 241 | 181 | 68 | 143 |
| | 19 | 147 | 4 | 295 | 186 | 144 | 73 | 148 | 14 |
| | 40 | 0 | 0 | 0 | 0 | 0 | 0 | 0 | 0 |
| 19 | 0 | 60 | 145 | 64 | 8 | 0 | 87 | 12 | 179 |
| | 1 | 73 | 213 | 181 | 6 | 0 | 110 | 6 | 108 |
| | 7 | 72 | 344 | 101 | 103 | 118 | 147 | 166 | 159 |
| | 8 | 127 | 242 | 270 | 198 | 144 | 258 | 184 | 138 |
| | 10 | 224 | 197 | 41 | 8 | 0 | 204 | 191 | 196 |
| | 41 | 0 | 0 | 0 | 0 | 0 | 0 | 0 | 0 |
| 20 | 0 | 151 | 187 | 301 | 105 | 265 | 89 | 6 | 77 |
| | 3 | 186 | 206 | 162 | 210 | 81 | 65 | 12 | 187 |
| | 9 | 217 | 264 | 40 | 121 | 90 | 155 | 15 | 203 |
| | 11 | 47 | 341 | 130 | 214 | 144 | 244 | 5 | 167 |
| | 22 | 160 | 59 | 10 | 183 | 228 | 30 | 30 | 130 |
| | 42 | 0 | 0 | 0 | 0 | 0 | 0 | 0 | 0 |
| 21 | 1 | 249 | 205 | 79 | 192 | 64 | 162 | 6 | 197 |
| | 5 | 121 | 102 | 175 | 131 | 46 | 264 | 86 | 122 |
| | 16 | 109 | 328 | 132 | 220 | 266 | 346 | 96 | 215 |
| | 20 | 131 | 213 | 283 | 50 | 9 | 143 | 42 | 65 |
| | 21 | 171 | 97 | 103 | 106 | 18 | 109 | 199 | 216 |
| | 43 | 0 | 0 | 0 | 0 | 0 | 0 | 0 | 0 |
| 22 | 0 | 64 | 30 | 177 | 53 | 72 | 280 | 44 | 25 |
| | 12 | 142 | 11 | 20 | 0 | 189 | 157 | 58 | 47 |
| | 13 | 188 | 233 | 55 | 3 | 72 | 236 | 130 | 126 |
| | 17 | 158 | 22 | 316 | 148 | 257 | 113 | 131 | 178 |
| | 44 | 0 | 0 | 0 | 0 | 0 | 0 | 0 | 0 |
| 23 | 1 | 156 | 24 | 249 | 88 | 180 | 18 | 45 | 185 |
| | 2 | 147 | 89 | 50 | 203 | 0 | 6 | 18 | 127 |
| | 10 | 170 | 61 | 133 | 168 | 0 | 181 | 132 | 117 |
| | 18 | 152 | 27 | 105 | 122 | 165 | 304 | 100 | 199 |
| | 45 | 0 | 0 | 0 | 0 | 0 | 0 | 0 | 0 |
| 24 | 0 | 112 | 298 | 289 | 49 | 236 | 38 | 9 | 32 |
| | 3 | 86 | 158 | 280 | 157 | 199 | 170 | 125 | 178 |
| | 4 | 236 | 235 | 110 | 64 | 0 | 249 | 191 | 2 |
| | 11 | 116 | 339 | 187 | 193 | 266 | 288 | 28 | 156 |
| | 22 | 222 | 234 | 281 | 124 | 0 | 194 | 6 | 58 |
| | 46 | 0 | 0 | 0 | 0 | 0 | 0 | 0 | 0 |
| 25 | 1 | 23 | 72 | 172 | 1 | 205 | 279 | 4 | 27 |
| | 6 | 136 | 17 | 295 | 166 | 0 | 255 | 74 | 141 |
| | 7 | 116 | 383 | 96 | 65 | 0 | 111 | 16 | 11 |
| | 14 | 182 | 312 | 46 | 81 | 183 | 54 | 28 | 181 |
| | 47 | 0 | 0 | 0 | 0 | 0 | 0 | 0 | 0 |
| 26 | 0 | 195 | 71 | 270 | 107 | 0 | 325 | 21 | 163 |
| | 2 | 243 | 81 | 110 | 176 | 0 | 326 | 142 | 131 |
| | 4 | 215 | 76 | 318 | 212 | 0 | 226 | 192 | 169 |
| | 15 | 61 | 136 | 67 | 127 | 277 | 99 | 197 | 98 |
| | 48 | 0 | 0 | 0 | 0 | 0 | 0 | 0 | 0 |
| 27 | 1 | 25 | 194 | 210 | 208 | 45 | 91 | 98 | 165 |
| | 6 | 104 | 194 | 29 | 141 | 36 | 326 | 140 | 232 |
| | 8 | 194 | 101 | 304 | 174 | 72 | 268 | 22 | 9 |
| | 49 | 0 | 0 | 0 | 0 | 0 | 0 | 0 | 0 |
| 28 | 0 | 128 | 222 | 11 | 146 | 275 | 102 | 4 | 32 |
| | 4 | 165 | 19 | 293 | 153 | 0 | 1 | 1 | 43 |
| | 19 | 181 | 244 | 50 | 217 | 155 | 40 | 40 | 200 |
| | 21 | 63 | 274 | 234 | 114 | 62 | 167 | 93 | 205 |
| | 50 | 0 | 0 | 0 | 0 | 0 | 0 | 0 | 0 |
| 29 | 1 | 86 | 252 | 27 | 150 | 0 | 273 | 92 | 232 |
| | 14 | 236 | 5 | 308 | 11 | 180 | 104 | 136 | 32 |
| | 18 | 84 | 147 | 117 | 53 | 0 | 243 | 106 | 118 |
| | 25 | 6 | 78 | 29 | 68 | 42 | 107 | 6 | 103 |
| | 51 | 0 | 0 | 0 | 0 | 0 | 0 | 0 | 0 |
| 30 | 0 | 216 | 159 | 91 | 34 | 0 | 171 | 2 | 170 |
| | 10 | 73 | 229 | 23 | 130 | 90 | 16 | 88 | 199 |
| | 13 | 120 | 260 | 105 | 210 | 252 | 95 | 112 | 26 |
| | 24 | 9 | 90 | 135 | 123 | 173 | 212 | 20 | 105 |
| | 52 | 0 | 0 | 0 | 0 | 0 | 0 | 0 | 0 |
| 31 | 1 | 95 | 100 | 222 | 175 | 144 | 101 | 4 | 73 |
| | 7 | 177 | 215 | 308 | 49 | 144 | 297 | 49 | 149 |
| | 22 | 172 | 258 | 66 | 177 | 166 | 279 | 125 | 175 |
| | 25 | 61 | 256 | 162 | 128 | 19 | 222 | 194 | 108 |
| | 53 | 0 | 0 | 0 | 0 | 0 | 0 | 0 | 0 |
| 32 | 0 | 221 | 102 | 210 | 192 | 0 | 351 | 6 | 103 |
| | 12 | 112 | 201 | 22 | 209 | 211 | 265 | 126 | 110 |
| | 14 | 199 | 175 | 271 | 58 | 36 | 338 | 63 | 151 |
| | 24 | 121 | 287 | 217 | 30 | 162 | 83 | 20 | 211 |
| | 54 | 0 | 0 | 0 | 0 | 0 | 0 | 0 | 0 |
| 33 | 1 | 2 | 323 | 170 | 114 | 0 | 56 | 10 | 199 |
| | 2 | 187 | 8 | 20 | 49 | 0 | 304 | 30 | 132 |
| | 11 | 41 | 361 | 140 | 161 | 76 | 141 | 6 | 172 |
| | 21 | 211 | 105 | 33 | 137 | 18 | 101 | 92 | 65 |
| | 55 | 0 | 0 | 0 | 0 | 0 | 0 | 0 | 0 |
| 34 | 0 | 127 | 230 | 187 | 82 | 197 | 60 | 4 | 161 |
| | 7 | 167 | 148 | 296 | 186 | 0 | 320 | 153 | 237 |
| | 15 | 164 | 202 | 5 | 68 | 108 | 112 | 197 | 142 |
| | 17 | 159 | 312 | 44 | 150 | 0 | 54 | 155 | 180 |
| | 56 | 0 | 0 | 0 | 0 | 0 | 0 | 0 | 0 |
| 35 | 1 | 161 | 320 | 207 | 192 | 199 | 100 | 4 | 231 |
| | 6 | 197 | 335 | 158 | 173 | 278 | 210 | 45 | 174 |
| | 12 | 207 | 2 | 55 | 26 | 0 | 195 | 168 | 145 |

TABLE 2-continued

Base graph 1 ($H_{BG}$) of LDPC encoding and corresponding PCM ($V_{i,j}$)

| Row index i | Column index j | \multicolumn{8}{c}{$V_{i,j}$ Set index $i_{LS}$} | | | | | | | |
|---|---|---|---|---|---|---|---|---|---|
| | | 0 | 1 | 2 | 3 | 4 | 5 | 6 | 7 |
| | 22 | 103 | 266 | 285 | 187 | 205 | 268 | 185 | 100 |
| | 57 | 0 | 0 | 0 | 0 | 0 | 0 | 0 | 0 |
| 36 | 0 | 37 | 210 | 259 | 222 | 216 | 135 | 6 | 11 |
| | 14 | 105 | 313 | 179 | 157 | 16 | 15 | 200 | 207 |
| | 15 | 51 | 297 | 178 | 0 | 0 | 35 | 177 | 42 |
| | 18 | 120 | 21 | 160 | 6 | 0 | 188 | 43 | 100 |
| | 58 | 0 | 0 | 0 | 0 | 0 | 0 | 0 | 0 |
| 37 | 1 | 198 | 269 | 298 | 81 | 72 | 319 | 82 | 59 |
| | 13 | 220 | 82 | 15 | 195 | 144 | 236 | 2 | 204 |
| | 23 | 122 | 115 | 115 | 138 | 0 | 85 | 135 | 161 |
| | 59 | 0 | 0 | 0 | 0 | 0 | 0 | 0 | 0 |
| 38 | 0 | 167 | 185 | 151 | 123 | 190 | 164 | 91 | 121 |
| | 9 | 151 | 177 | 179 | 90 | 0 | 196 | 64 | 90 |
| | 10 | 157 | 289 | 64 | 73 | 0 | 209 | 198 | 26 |
| | 12 | 163 | 214 | 181 | 10 | 0 | 246 | 100 | 140 |
| | 60 | 0 | 0 | 0 | 0 | 0 | 0 | 0 | 0 |
| 39 | 1 | 173 | 258 | 102 | 12 | 153 | 236 | 4 | 115 |
| | 3 | 139 | 93 | 77 | 77 | 0 | 264 | 28 | 188 |
| | 7 | 149 | 346 | 192 | 49 | 165 | 37 | 109 | 168 |
| | 19 | 0 | 297 | 208 | 114 | 117 | 272 | 188 | 52 |
| | 61 | 0 | 0 | 0 | 0 | 0 | 0 | 0 | 0 |
| 40 | 0 | 157 | 175 | 32 | 67 | 216 | 304 | 10 | 4 |
| | 8 | 137 | 37 | 80 | 45 | 144 | 237 | 84 | 103 |
| | 17 | 149 | 312 | 197 | 96 | 2 | 135 | 12 | 30 |
| | 62 | 0 | 0 | 0 | 0 | 0 | 0 | 0 | 0 |
| 41 | 1 | 167 | 52 | 154 | 23 | 0 | 123 | 2 | 53 |
| | 3 | 173 | 314 | 47 | 215 | 0 | 77 | 75 | 189 |
| | 9 | 139 | 139 | 124 | 60 | 0 | 25 | 142 | 215 |
| | 18 | 151 | 288 | 207 | 167 | 183 | 272 | 128 | 24 |
| | 63 | 0 | 0 | 0 | 0 | 0 | 0 | 0 | 0 |
| 42 | 0 | 149 | 113 | 226 | 114 | 27 | 288 | 163 | 222 |
| | 4 | 157 | 14 | 65 | 91 | 0 | 83 | 10 | 170 |
| | 24 | 137 | 218 | 126 | 78 | 35 | 17 | 162 | 71 |
| | 64 | 0 | 0 | 0 | 0 | 0 | 0 | 0 | 0 |
| 43 | 1 | 151 | 113 | 228 | 206 | 52 | 210 | 1 | 22 |
| | 16 | 163 | 132 | 69 | 22 | 243 | 3 | 163 | 127 |
| | 18 | 173 | 114 | 176 | 134 | 0 | 53 | 99 | 49 |
| | 25 | 139 | 168 | 102 | 161 | 270 | 167 | 98 | 125 |
| | 65 | 0 | 0 | 0 | 0 | 0 | 0 | 0 | 0 |
| 44 | 0 | 139 | 80 | 234 | 84 | 18 | 79 | 4 | 191 |
| | 7 | 157 | 78 | 227 | 4 | 0 | 244 | 6 | 211 |
| | 9 | 163 | 163 | 259 | 9 | 0 | 293 | 142 | 187 |
| | 22 | 173 | 274 | 260 | 12 | 57 | 272 | 3 | 148 |
| | 66 | 0 | 0 | 0 | 0 | 0 | 0 | 0 | 0 |
| 45 | 1 | 149 | 135 | 101 | 184 | 168 | 82 | 181 | 177 |
| | 6 | 151 | 149 | 228 | 121 | 0 | 67 | 45 | 114 |
| | 10 | 167 | 15 | 126 | 29 | 144 | 235 | 153 | 93 |
| | 67 | 0 | 0 | 0 | 0 | 0 | 0 | 0 | 0 |

TABLE 3

Base graph 2 ($H_{BG}$) of LDPC encoding and corresponding PCM ($V_{i,j}$)

| Row index i | Column index j | \multicolumn{8}{c}{$V_{i,j}$ Set index $i_{LS}$} | | | | | | | |
|---|---|---|---|---|---|---|---|---|---|
| | | 0 | 1 | 2 | 3 | 4 | 5 | 6 | 7 |
| 0 | 0 | 9 | 174 | 0 | 72 | 3 | 156 | 143 | 145 |
| | 1 | 117 | 97 | 0 | 110 | 26 | 143 | 19 | 131 |
| | 2 | 204 | 166 | 0 | 23 | 53 | 14 | 176 | 71 |
| | 3 | 26 | 66 | 0 | 181 | 35 | 3 | 165 | 21 |
| | 6 | 189 | 71 | 0 | 95 | 115 | 40 | 196 | 23 |
| | 9 | 205 | 172 | 0 | 8 | 127 | 123 | 13 | 112 |
| | 10 | 0 | 0 | 0 | 1 | 0 | 0 | 0 | 1 |
| | 11 | 0 | 0 | 0 | 0 | 0 | 0 | 0 | 0 |
| 1 | 0 | 167 | 27 | 137 | 53 | 19 | 17 | 18 | 142 |
| | 3 | 166 | 36 | 124 | 156 | 94 | 65 | 27 | 174 |
| | 4 | 253 | 48 | 0 | 115 | 104 | 63 | 3 | 183 |
| | 5 | 125 | 92 | 0 | 156 | 66 | 1 | 102 | 27 |
| | 6 | 226 | 31 | 88 | 115 | 84 | 55 | 185 | 96 |
| | 7 | 156 | 187 | 0 | 200 | 98 | 37 | 17 | 23 |
| | 8 | 224 | 185 | 0 | 29 | 69 | 171 | 14 | 9 |
| | 9 | 252 | 3 | 55 | 31 | 50 | 133 | 180 | 167 |
| | 11 | 0 | 0 | 0 | 0 | 0 | 0 | 0 | 0 |
| | 12 | 0 | 0 | 0 | 0 | 0 | 0 | 0 | 0 |
| 2 | 0 | 81 | 25 | 20 | 152 | 95 | 98 | 126 | 74 |
| | 1 | 114 | 114 | 94 | 131 | 106 | 168 | 163 | 31 |
| | 3 | 44 | 117 | 99 | 46 | 92 | 107 | 47 | 3 |
| | 4 | 52 | 110 | 9 | 191 | 110 | 82 | 183 | 53 |
| | 8 | 240 | 114 | 108 | 91 | 111 | 142 | 132 | 155 |
| | 10 | 1 | 1 | 1 | 0 | 1 | 1 | 1 | 0 |
| | 13 | 0 | 0 | 0 | 0 | 0 | 0 | 0 | 0 |
| 3 | 1 | 8 | 136 | 38 | 185 | 120 | 53 | 36 | 239 |
| | 2 | 58 | 175 | 15 | 6 | 121 | 174 | 48 | 171 |
| | 4 | 158 | 113 | 102 | 36 | 22 | 174 | 18 | 95 |
| | 5 | 104 | 72 | 146 | 124 | 4 | 127 | 111 | 110 |
| | 6 | 209 | 123 | 12 | 124 | 73 | 17 | 203 | 159 |
| | 7 | 54 | 118 | 57 | 110 | 49 | 89 | 3 | 199 |
| | 8 | 18 | 28 | 53 | 156 | 128 | 17 | 191 | 43 |
| | 9 | 128 | 186 | 46 | 133 | 79 | 105 | 160 | 75 |
| | 10 | 0 | 0 | 0 | 1 | 0 | 0 | 0 | 1 |
| | 13 | 0 | 0 | 0 | 0 | 0 | 0 | 0 | 0 |
| 4 | 0 | 179 | 72 | 0 | 200 | 42 | 86 | 43 | 29 |
| | 1 | 214 | 74 | 136 | 16 | 24 | 67 | 27 | 140 |
| | 11 | 71 | 29 | 157 | 101 | 51 | 83 | 117 | 180 |
| | 14 | 0 | 0 | 0 | 0 | 0 | 0 | 0 | 0 |
| 5 | 0 | 231 | 10 | 0 | 185 | 40 | 79 | 136 | 121 |
| | 1 | 41 | 44 | 131 | 138 | 140 | 84 | 49 | 41 |
| | 5 | 194 | 121 | 142 | 170 | 84 | 35 | 36 | 169 |
| | 7 | 159 | 80 | 141 | 219 | 137 | 103 | 132 | 88 |
| | 11 | 103 | 48 | 64 | 193 | 71 | 60 | 62 | 207 |
| | 15 | 0 | 0 | 0 | 0 | 0 | 0 | 0 | 0 |
| 6 | 0 | 155 | 129 | 0 | 123 | 109 | 47 | 7 | 137 |
| | 5 | 228 | 92 | 124 | 55 | 87 | 154 | 34 | 72 |
| | 7 | 45 | 100 | 99 | 31 | 107 | 10 | 198 | 172 |
| | 9 | 28 | 49 | 45 | 222 | 133 | 155 | 168 | 124 |
| | 11 | 158 | 184 | 148 | 209 | 139 | 29 | 12 | 56 |
| | 16 | 0 | 0 | 0 | 0 | 0 | 0 | 0 | 0 |
| 7 | 1 | 129 | 80 | 0 | 103 | 97 | 48 | 163 | 86 |
| | 5 | 147 | 186 | 45 | 13 | 135 | 125 | 78 | 186 |
| | 7 | 140 | 16 | 148 | 105 | 35 | 24 | 143 | 87 |
| | 11 | 3 | 102 | 96 | 150 | 108 | 47 | 107 | 172 |
| | 13 | 116 | 143 | 78 | 181 | 65 | 55 | 58 | 154 |
| | 17 | 0 | 0 | 0 | 0 | 0 | 0 | 0 | 0 |
| 8 | 0 | 142 | 118 | 0 | 147 | 70 | 53 | 101 | 176 |
| | 1 | 94 | 70 | 65 | 43 | 69 | 31 | 177 | 169 |
| | 12 | 230 | 152 | 87 | 152 | 88 | 161 | 22 | 225 |
| | 18 | 0 | 0 | 0 | 0 | 0 | 0 | 0 | 0 |
| 9 | 1 | 203 | 28 | 0 | 2 | 97 | 104 | 186 | 167 |
| | 8 | 205 | 132 | 97 | 30 | 40 | 142 | 27 | 238 |
| | 10 | 61 | 185 | 51 | 184 | 24 | 99 | 205 | 48 |
| | 11 | 247 | 178 | 85 | 83 | 49 | 64 | 81 | 68 |
| | 19 | 0 | 0 | 0 | 0 | 0 | 0 | 0 | 0 |
| 10 | 0 | 11 | 59 | 0 | 174 | 46 | 111 | 125 | 38 |
| | 1 | 185 | 104 | 17 | 150 | 41 | 25 | 60 | 217 |
| | 6 | 0 | 22 | 156 | 8 | 101 | 174 | 177 | 208 |
| | 7 | 117 | 52 | 20 | 56 | 96 | 23 | 51 | 232 |
| | 20 | 0 | 0 | 0 | 0 | 0 | 0 | 0 | 0 |
| 11 | 0 | 11 | 32 | 0 | 99 | 28 | 91 | 39 | 178 |
| | 7 | 236 | 92 | 7 | 138 | 30 | 175 | 29 | 214 |
| | 9 | 210 | 174 | 4 | 110 | 116 | 24 | 35 | 168 |
| | 13 | 56 | 154 | 2 | 99 | 64 | 141 | 8 | 51 |
| | 21 | 0 | 0 | 0 | 0 | 0 | 0 | 0 | 0 |
| 12 | 1 | 63 | 39 | 0 | 46 | 33 | 122 | 18 | 124 |
| | 3 | 111 | 93 | 113 | 217 | 122 | 11 | 155 | 122 |

TABLE 3-continued

Base graph 2 ($H_{BG}$) of LDPC encoding and corresponding PCM ($V_{i,j}$)

| $H_{BG}$ Row index i | Column index j | $V_{i,j}$ Set index $i_{LS}$ 0 | 1 | 2 | 3 | 4 | 5 | 6 | 7 |
|---|---|---|---|---|---|---|---|---|---|
|  | 11 | 14 | 11 | 48 | 109 | 131 | 4 | 49 | 72 |
|  | 22 | 0 | 0 | 0 | 0 | 0 | 0 | 0 | 0 |
| 13 | 0 | 83 | 49 | 0 | 37 | 76 | 29 | 32 | 48 |
|  | 1 | 2 | 125 | 112 | 113 | 37 | 91 | 53 | 57 |
|  | 8 | 38 | 35 | 102 | 143 | 62 | 27 | 95 | 167 |
|  | 13 | 222 | 166 | 26 | 140 | 47 | 127 | 186 | 219 |
|  | 23 | 0 | 0 | 0 | 0 | 0 | 0 | 0 | 0 |
| 14 | 1 | 115 | 19 | 0 | 36 | 143 | 11 | 91 | 82 |
|  | 6 | 145 | 118 | 138 | 95 | 51 | 145 | 20 | 232 |
|  | 11 | 3 | 21 | 57 | 40 | 130 | 8 | 52 | 204 |
|  | 13 | 232 | 163 | 27 | 116 | 97 | 166 | 109 | 162 |
|  | 24 | 0 | 0 | 0 | 0 | 0 | 0 | 0 | 0 |
| 15 | 0 | 51 | 68 | 0 | 116 | 139 | 137 | 174 | 38 |
|  | 10 | 175 | 63 | 73 | 200 | 96 | 103 | 108 | 217 |
|  | 11 | 213 | 81 | 99 | 110 | 128 | 40 | 102 | 157 |
|  | 25 | 0 | 0 | 0 | 0 | 0 | 0 | 0 | 0 |
| 16 | 1 | 203 | 87 | 9 | 75 | 48 | 78 | 125 | 170 |
|  | 9 | 142 | 177 | 79 | 158 | 9 | 158 | 31 | 23 |
|  | 11 | 8 | 135 | 111 | 134 | 28 | 17 | 54 | 175 |
|  | 12 | 242 | 64 | 143 | 97 | 8 | 165 | 176 | 202 |
| 16 | 26 | 0 | 0 | 0 | 0 | 0 | 0 | 0 | 0 |
| 17 | 1 | 254 | 158 | 0 | 48 | 120 | 134 | 57 | 196 |
|  | 5 | 124 | 23 | 24 | 132 | 43 | 23 | 201 | 173 |
|  | 11 | 114 | 9 | 109 | 206 | 65 | 62 | 142 | 195 |
|  | 12 | 64 | 6 | 18 | 2 | 42 | 163 | 35 | 218 |
|  | 27 | 0 | 0 | 0 | 0 | 0 | 0 | 0 | 0 |
| 18 | 0 | 220 | 186 | 0 | 68 | 17 | 173 | 129 | 128 |
|  | 6 | 194 | 6 | 18 | 16 | 106 | 31 | 203 | 211 |
|  | 7 | 50 | 46 | 86 | 156 | 142 | 22 | 140 | 210 |
|  | 28 | 0 | 0 | 0 | 0 | 0 | 0 | 0 | 0 |
| 19 | 0 | 87 | 58 | 0 | 35 | 79 | 13 | 110 | 39 |
|  | 1 | 20 | 42 | 158 | 138 | 28 | 135 | 124 | 84 |
|  | 10 | 185 | 156 | 154 | 86 | 41 | 145 | 52 | 88 |
|  | 29 | 0 | 0 | 0 | 0 | 0 | 0 | 0 | 0 |
| 20 | 1 | 26 | 76 | 0 | 6 | 2 | 128 | 196 | 117 |
|  | 4 | 105 | 61 | 148 | 20 | 103 | 52 | 35 | 227 |
|  | 11 | 29 | 153 | 104 | 141 | 78 | 173 | 114 | 6 |
|  | 30 | 0 | 0 | 0 | 0 | 0 | 0 | 0 | 0 |
| 21 | 0 | 76 | 157 | 0 | 80 | 91 | 156 | 10 | 238 |
|  | 8 | 42 | 175 | 17 | 43 | 75 | 166 | 122 | 13 |
|  | 13 | 210 | 67 | 33 | 81 | 81 | 40 | 23 | 11 |
|  | 31 | 0 | 0 | 0 | 0 | 0 | 0 | 0 | 0 |
| 22 | 1 | 222 | 20 | 0 | 49 | 54 | 18 | 202 | 195 |
|  | 2 | 63 | 52 | 4 | 1 | 132 | 163 | 126 | 44 |
|  | 32 | 0 | 0 | 0 | 0 | 0 | 0 | 0 | 0 |
| 23 | 0 | 23 | 106 | 0 | 156 | 68 | 110 | 52 | 5 |
|  | 3 | 235 | 86 | 75 | 54 | 115 | 132 | 170 | 94 |
|  | 5 | 238 | 95 | 158 | 134 | 56 | 150 | 13 | 111 |
|  | 33 | 0 | 0 | 0 | 0 | 0 | 0 | 0 | 0 |
| 24 | 1 | 46 | 182 | 0 | 153 | 30 | 113 | 113 | 81 |
|  | 2 | 139 | 153 | 69 | 88 | 42 | 108 | 161 | 19 |
|  | 9 | 8 | 64 | 87 | 63 | 101 | 61 | 88 | 130 |
|  | 34 | 0 | 0 | 0 | 0 | 0 | 0 | 0 | 0 |
| 25 | 0 | 228 | 45 | 0 | 211 | 128 | 72 | 197 | 66 |
|  | 5 | 156 | 21 | 65 | 94 | 63 | 136 | 194 | 95 |
|  | 35 | 0 | 0 | 0 | 0 | 0 | 0 | 0 | 0 |
| 26 | 2 | 29 | 67 | 0 | 90 | 142 | 36 | 164 | 146 |
|  | 7 | 143 | 137 | 100 | 6 | 28 | 38 | 172 | 66 |
|  | 12 | 160 | 55 | 13 | 221 | 100 | 53 | 49 | 190 |
|  | 13 | 122 | 85 | 7 | 6 | 133 | 145 | 161 | 86 |
|  | 36 | 0 | 0 | 0 | 0 | 0 | 0 | 0 | 0 |
| 27 | 0 | 8 | 103 | 0 | 27 | 13 | 42 | 168 | 64 |
|  | 6 | 151 | 50 | 32 | 118 | 10 | 104 | 193 | 181 |
|  | 37 | 0 | 0 | 0 | 0 | 0 | 0 | 0 | 0 |
| 28 | 1 | 98 | 70 | 0 | 216 | 106 | 64 | 14 | 7 |
|  | 2 | 101 | 111 | 126 | 212 | 77 | 24 | 186 | 144 |
|  | 5 | 135 | 168 | 110 | 193 | 43 | 149 | 46 | 16 |
|  | 38 | 0 | 0 | 0 | 0 | 0 | 0 | 0 | 0 |
| 29 | 0 | 18 | 110 | 0 | 108 | 133 | 139 | 50 | 25 |
|  | 4 | 28 | 17 | 154 | 61 | 25 | 161 | 27 | 57 |
|  | 39 | 0 | 0 | 0 | 0 | 0 | 0 | 0 | 0 |
| 30 | 2 | 71 | 120 | 0 | 106 | 87 | 84 | 70 | 37 |
|  | 5 | 240 | 154 | 35 | 44 | 56 | 173 | 17 | 139 |
|  | 7 | 9 | 52 | 51 | 185 | 104 | 93 | 50 | 221 |
|  | 9 | 84 | 56 | 134 | 176 | 70 | 29 | 6 | 17 |
|  | 40 | 0 | 0 | 0 | 0 | 0 | 0 | 0 | 0 |
| 31 | 1 | 106 | 3 | 0 | 147 | 80 | 117 | 115 | 201 |
|  | 13 | 1 | 170 | 20 | 182 | 139 | 148 | 189 | 46 |
|  | 41 | 0 | 0 | 0 | 0 | 0 | 0 | 0 | 0 |
| 32 | 0 | 242 | 84 | 0 | 108 | 32 | 116 | 110 | 179 |
|  | 5 | 44 | 8 | 20 | 21 | 89 | 73 | 0 | 14 |
|  | 12 | 166 | 17 | 122 | 110 | 71 | 142 | 163 | 116 |
|  | 42 | 0 | 0 | 0 | 0 | 0 | 0 | 0 | 0 |
| 33 | 2 | 132 | 165 | 0 | 71 | 135 | 105 | 163 | 46 |
|  | 7 | 164 | 179 | 88 | 12 | 6 | 137 | 173 | 2 |
|  | 10 | 235 | 124 | 13 | 109 | 2 | 29 | 179 | 106 |
|  | 43 | 0 | 0 | 0 | 0 | 0 | 0 | 0 | 0 |
| 34 | 0 | 147 | 173 | 0 | 29 | 37 | 11 | 197 | 184 |
|  | 12 | 85 | 177 | 19 | 201 | 25 | 41 | 191 | 135 |
|  | 13 | 36 | 12 | 78 | 69 | 114 | 162 | 193 | 141 |
|  | 44 | 0 | 0 | 0 | 0 | 0 | 0 | 0 | 0 |
| 35 | 1 | 57 | 77 | 0 | 91 | 60 | 126 | 157 | 85 |
|  | 5 | 40 | 184 | 157 | 165 | 137 | 152 | 167 | 225 |
|  | 11 | 63 | 18 | 6 | 55 | 93 | 172 | 181 | 175 |
|  | 45 | 0 | 0 | 0 | 0 | 0 | 0 | 0 | 0 |
| 36 | 0 | 140 | 25 | 0 | 1 | 121 | 73 | 197 | 178 |
|  | 2 | 38 | 151 | 63 | 175 | 129 | 154 | 167 | 112 |
|  | 7 | 154 | 170 | 82 | 83 | 26 | 129 | 179 | 106 |
|  | 46 | 0 | 0 | 0 | 0 | 0 | 0 | 0 | 0 |
| 37 | 10 | 219 | 37 | 0 | 40 | 97 | 167 | 181 | 154 |
|  | 13 | 151 | 31 | 144 | 12 | 56 | 38 | 193 | 114 |
|  | 47 | 0 | 0 | 0 | 0 | 0 | 0 | 0 | 0 |
| 38 | 1 | 31 | 84 | 0 | 37 | 1 | 112 | 157 | 42 |
|  | 5 | 66 | 151 | 93 | 97 | 70 | 7 | 173 | 41 |
|  | 11 | 38 | 190 | 19 | 46 | 1 | 19 | 191 | 105 |
|  | 48 | 0 | 0 | 0 | 0 | 0 | 0 | 0 | 0 |
| 39 | 0 | 239 | 93 | 0 | 106 | 119 | 109 | 181 | 167 |
|  | 7 | 172 | 132 | 24 | 181 | 32 | 6 | 157 | 45 |
|  | 12 | 34 | 57 | 138 | 154 | 142 | 105 | 173 | 189 |
|  | 49 | 0 | 0 | 0 | 0 | 0 | 0 | 0 | 0 |
| 40 | 2 | 0 | 103 | 0 | 98 | 6 | 160 | 193 | 78 |
|  | 10 | 75 | 107 | 36 | 35 | 73 | 156 | 163 | 67 |
|  | 13 | 120 | 163 | 143 | 36 | 102 | 82 | 179 | 180 |
|  | 50 | 0 | 0 | 0 | 0 | 0 | 0 | 0 | 0 |
| 41 | 1 | 129 | 147 | 0 | 120 | 48 | 132 | 191 | 53 |
|  | 5 | 229 | 7 | 2 | 101 | 47 | 6 | 197 | 215 |
|  | 11 | 118 | 60 | 55 | 81 | 19 | 8 | 167 | 230 |
|  | 51 | 0 | 0 | 0 | 0 | 0 | 0 | 0 | 0 |

The following describes this embodiment in combination with exemplary embodiments.

Exemplary Embodiment One

A data communication processing method, applied to a communication device or a UE, includes: receiving control information from a wireless communication node, the wireless communication node includes a base station (BS), and the control information is downlink control information (DCI).

The control information at least includes: modulation and coding scheme (MCS) field information. The MCS field information is applied to: determine the modulation order and the target code rate from an MCS table according to the MCS field information, calculate an intermediate number $N_{info}$ of information bits at least according to a total number of resource elements, the modulation order and the target code rate; quantize the intermediate number $N_{info}$ of the information bits to obtain the quantized intermediate number $N'_{info}$; select one TBS from a one-dimensional TBS table according to the quantized intermediate number $N'_{info}$.

The UE demodulates and decodes data from the base station according to the TBS to obtain received data with a size of TBS; or performs low density parity check code (LDPC) encoding on information bits data of a length of TBS to obtain the encoded data, and sends the encoded data to the base station.

In an embodiment, the UE determines the TBS through steps described below.

In step 10: the UE first determines a total number of resource elements (REs) (NRE) in a slot.

The number of resource elements $N_{RE}'$ allocated in a physical resource block (PRB) is determined by the following calculation formula: $N_{RE}'=N_{sc}^{RB} \cdot N_{symb}^{sh} - N_{DMRS}^{PRB} - N_{oh}^{PRB}$, where $N_{sc}^{RB}=12$ indicates the number of subcarriers included in a PRB in a frequency domain, $N_{symb}^{sh}$ indicates the number of orthogonal frequency division multiplexing (OFDM) symbols that can be scheduled in a slot, $N_{DMRS}^{PRB}$ indicates the number of REs occupied by demodulation reference signals (DM-RS) in each PRB within a schedulable duration (including overhead of DMRS code division multiplexing (CDM) groups indicated by a DCI format 1_0/1_1); and $N_{oh}^{PRB}$ indicates overhead of high layer configuration parameter Xoh-PDSCH. If Xoh-PDSCH is not configured (a value of Xoh-PDSCH is one of {0, 6, 12, 18}), the Xoh-PDSCH is configured to be 0.

According to the calculated number of available REs $N_{RE}'$ in each PRB, the total number of resource elements (NRE) is calculated according to $N_{RE}=\min(156, N_{RE}') \cdot n_{PRB}$, where $n_{PRB}$ is the total number of allocated resource blocks, which is determined by frequency field resource field signaling in downlink control signaling.

In step 20: an intermediate number $N_{info}$ of information bits is calculated at least according to a total number of resource elements, the modulation order and the target code rate, where the calculation formula is as follows: $N_{info}=N_{RE} \cdot R \cdot Q_m \cdot v$.

$N_{RE}$ in the above formula is the total number of the resource elements, R is the target code rate, $Q_m$ is the modulation order, v is the layer number. The modulation order and the target code rate are determined from the MCS table based on the MCS field information received by the UE.

If the calculated intermediate number $N_{info}$ of the information bits is less than or equal to 3824 (a preset threshold is equal to 3824), then the TBS is determined according to step 3; if the intermediate number $N_{info}$ is greater than 3824, the TBS is determined according to step 4.

In step 30: when the intermediate number $N_{info} \leq 3824$ (the preset threshold is equal to 3824), the TBS is determined according to the following processing method:

quantizing and calculating the intermediate number $N_{info}$ of the information bits to obtain the quantized intermediate number $N'_{info}$. in this embodiment, the quantizing and calculating the intermediate number $N_{info}$ of the information bits to obtain the quantized intermediate number $N'_{info}$ includes one of the following methods to obtain the quantized intermediate number $N'_{info}$.

Method one:

$$N'_{info} = \max\left(24, 2^n * \left\lfloor \frac{N_{info} - \text{Offset}}{2^n} \right\rfloor\right),$$

the Offset is determined by the intermediate number, in an embodiment, the Offset is equal to a positive integer times an nth power of 2, $n=\max(3, \lfloor\log_2(N_{info})\rfloor-6)$, the positive integer is equal to 1, 2, 3, 4, 5 or 6. In an embodiment, the positive integer is equal to 3.

Method two:

$$N'_{info} = \max\left(24, 2^n * \left\lfloor \frac{N_{info}}{2^n} \right\rfloor\right) - \text{Offset},$$

the Offset is determined by the intermediate number, in an embodiment, the Offset is equal to a positive integer times an nth power of 2, $n=\max(3, \lfloor\log_2(N_{info})\rfloor-6)$, the positive integer is equal to 1, 2, 3, 4, 5 or 6. In an embodiment, the positive integer is equal to 3.

Method three:

$$N'_{info} = \max\left(24, 2^n * \left\lfloor \frac{N_{info}}{2^n} - \alpha \right\rfloor\right),$$

where $n=\max(3, \lfloor\log_2(N_{info})\rfloor-6)$, α is equal to 1, 2, 3, 4, 5 or 6. In an embodiment, α is equal to 3;

Method four:

$$N'_{info} = \max\left(24, 2^n * \left(\left\lfloor \frac{N_{info}}{2^n} \right\rfloor - \alpha\right)\right),$$

where $n=\max(3, \lfloor\log_2(N_{info})\rfloor-6)$, a is equal to 1, 2, 3, 4, 5 or 6. In an embodiment, a is equal to 3.

From the one-dimensional TBS table of Table 1-1, a TBS which is not less than and closest to a final TBS is found.

TABLE 1-1

| TBS table ($N_{info} \leq 3824$) | |
| --- | --- |
| Index | TBS |
| 1 | 24 |
| 2 | 32 |
| 3 | 40 |
| 4 | 48 |
| 5 | 56 |
| 6 | 64 |
| 7 | 72 |
| 8 | 80 |
| 9 | 88 |
| 10 | 96 |
| 11 | 104 |
| 12 | 112 |
| 13 | 120 |
| 14 | 128 |
| 15 | 136 |
| 16 | 144 |
| 17 | 152 |
| 18 | 160 |
| 19 | 168 |
| 20 | 176 |
| 21 | 184 |
| 22 | 192 |
| 23 | 208 |
| 24 | 224 |
| 25 | 240 |
| 26 | 256 |
| 27 | 272 |
| 28 | 288 |
| 29 | 304 |
| 30 | 320 |
| 31 | 336 |

TABLE 1-1-continued

TBS table ($N_{info} \le 3824$)

| Index | TBS |
|---|---|
| 32 | 352 |
| 33 | 368 |
| 34 | 384 |
| 35 | 408 |
| 36 | 432 |
| 37 | 456 |
| 38 | 480 |
| 39 | 504 |
| 40 | 528 |
| 41 | 552 |
| 42 | 576 |
| 43 | 608 |
| 44 | 640 |
| 45 | 672 |
| 46 | 704 |
| 47 | 736 |
| 48 | 768 |
| 49 | 808 |
| 50 | 848 |
| 51 | 888 |
| 52 | 928 |
| 53 | 984 |
| 54 | 1032 |
| 55 | 1064 |
| 56 | 1128 |
| 57 | 1160 |
| 58 | 1192 |
| 59 | 1224 |
| 60 | 1256 |
| 61 | 1288 |
| 62 | 1320 |
| 63 | 1352 |
| 64 | 1416 |
| 65 | 1480 |
| 66 | 1544 |
| 67 | 1608 |
| 68 | 1672 |
| 69 | 1736 |
| 70 | 1800 |
| 71 | 1864 |
| 72 | 1928 |
| 73 | 2024 |
| 74 | 2088 |
| 75 | 2152 |
| 76 | 2216 |
| 77 | 2280 |
| 78 | 2408 |
| 79 | 2472 |
| 80 | 2536 |
| 81 | 2600 |
| 82 | 2664 |
| 83 | 2728 |
| 84 | 2792 |
| 85 | 2856 |
| 86 | 2976 |
| 87 | 3104 |
| 88 | 3240 |
| 89 | 3368 |
| 90 | 3496 |
| 91 | 3624 |
| 92 | 3752 |
| 93 | 3824 |

In step 40: when the intermediate number $N_{info}>3824$ (the preset threshold is equal to 3824), the TBS is determined according to the following processing method:

quantizing the intermediate number:

$$N'_{info} = \max\left(3840, 2^n \times \text{round}\left(\frac{N_{info} - 24}{2^n}\right)\right),$$

where $n = \lfloor \log_2(N_{info} - 24) \rfloor - 5$, and round (•) refers to rounding;

if $R \le 1/4$ $$TBS = 8 * C * \left\lceil \frac{N'_{info} + 24}{8 * C} \right\rceil - 24, \text{ where } C = \left\lceil \frac{N'_{info} + 24}{3816} \right\rceil$$

else
   if $N_{info}' > 8424$ $$TBS = 8 * C * \left\lceil \frac{N'_{info} + 24}{8 * C} \right\rceil - 24, \text{ where } C = \left\lceil \frac{N'_{info} + 24}{8424} \right\rceil$$

else $$TBS = 8 * \left\lceil \frac{N'_{info} + 24}{8} \right\rceil - 24$$

end
end

In this embodiment, the preset thresholds in steps 20, 30, and 40 are equal to 3824, the preset thresholds are not limited to 3824, and the preset thresholds may be equal to any integer from 2048 to 6144. In an embodiment, the preset threshold may also be equal to 3816, 3840 or 3896.

Figure 3A:
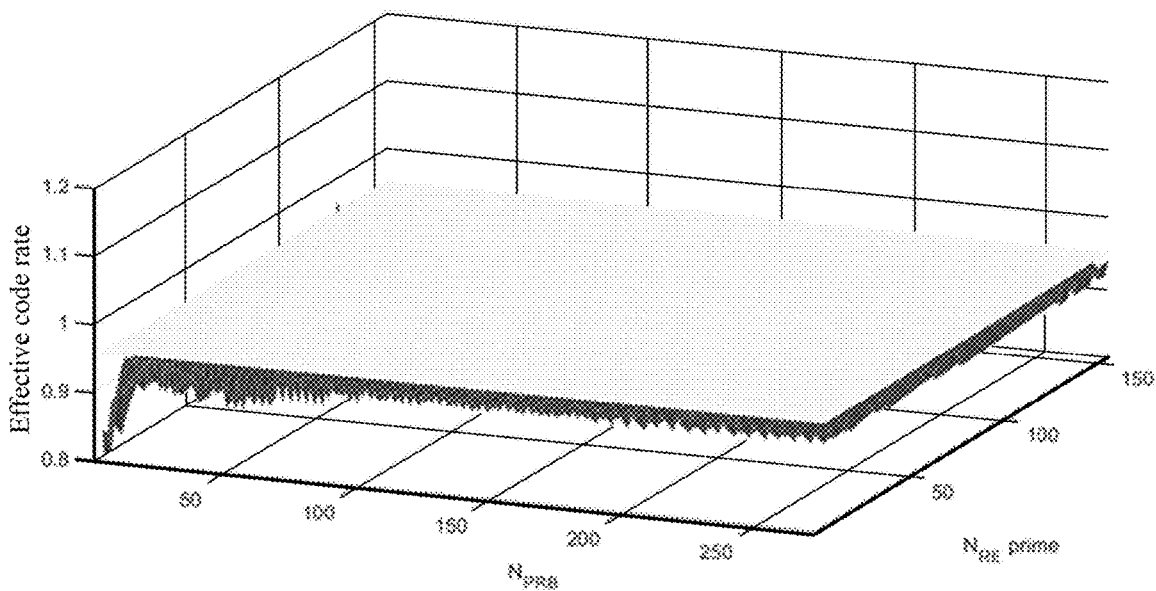
FIG. 3A is a schematic diagram of a code rate provided by an embodiment.
Figure 3B:
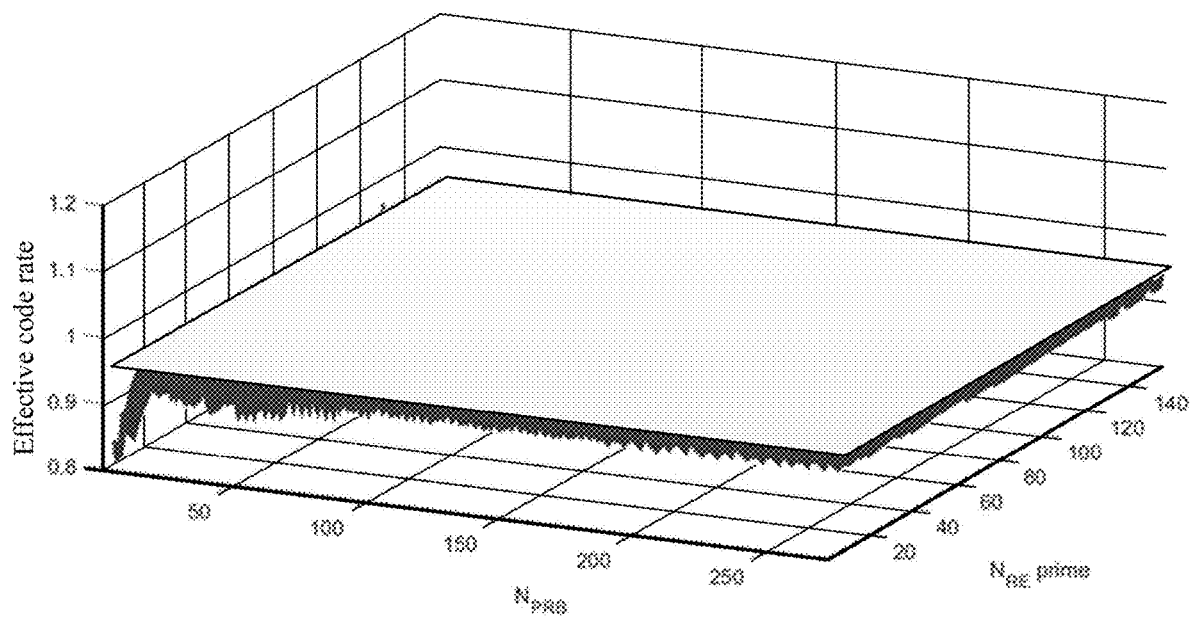
FIG. 3B is a schematic diagram of another code rate provided by an embodiment.
Figure 3C:
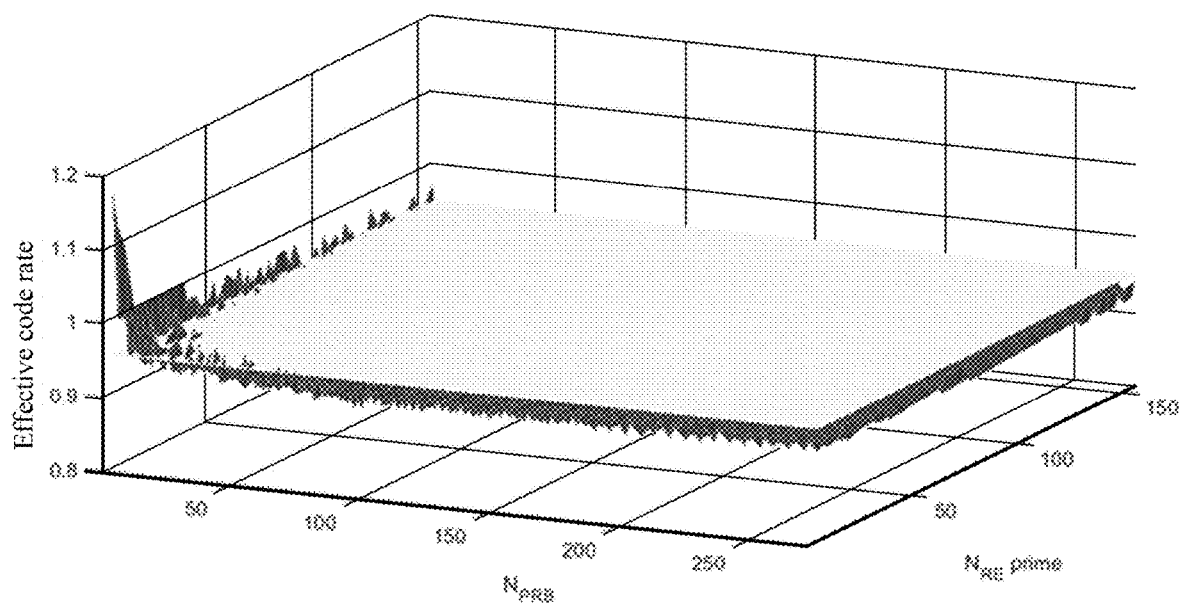
FIG. 3C is a schematic diagram of another code rate provided by an embodiment.

The performance comparison charts are shown in FIGS. 3A to 3C, a vertical ordinate is an effective code rate, two coordinates in a horizontal plane are the total number of allocated resource blocks (PRB) and the number of resource elements allocated in a resource block (PRB). FIG. 3A is a code rate diagram corresponding to quantizing the intermediate number $N_{info}$ of the information bits to obtain the quantized intermediate number $N'_{info}$ by using the method 1 in step 3, FIG. 3B is a code rate diagram corresponding to quantizing the intermediate number $N_{info}$ of the information bits to obtain the quantized intermediate number $N'_{info}$ by using the method 2 in step 3, and FIG. 3C is a code rate diagram corresponding to a quantization method without subtracting Offset (i.e., the quantization formula does not subtract Offset or α) by using the method 1 in step 3. It can be seen that for the MCS table shown in Table 1-3 (the highest modulation order is 8, which corresponds to 256QAM), most code rates obtained by subtracting Offset from the code rates obtained by using the quantization method are less than 0.95, so when LDPC is decoded, the LDPC may be decoded correctly. In the code rate diagram in FIG. 3C, it can be found that some code rates obtained by the quantization method without subtracting the Offset in the quantization formula are greater than 0.95, so retransmission is needed in actual work to guarantee performance, but retransmission brings a large latency. The quantization method has a relatively large advantage.

The processing method in step 30 is not limited to the above method, but may also be the following processing method.

When the intermediate number $N_{info} \le 3824$ (the preset threshold is equal to 3824), the TBS is determined according to the following processing method: quantizing and calculating the intermediate number $N_{info}$ of the information bits to obtain the quantized intermediate number $N'_{info}$; where the quantizing and calculating the intermediate number $N_{info}$ of the information bits to obtain the quantized intermediate number $N'_{info}$ includes one of the following methods to obtain the quantized intermediate number $N'_{info}$:

$$N'_{info} = \max\left(24, 2^n * \left\lfloor \frac{N_{info}}{2^n} \right\rfloor\right),$$

where n=max $(3, \lfloor \log_2(N_{info}) \rfloor - 6)$.

From the one-dimensional TBS table of Table 1-1, a TBS which is not less than and closest to a final TBS is found. The Offset is determined by the intermediate number $N_{info}$. In one embodiment, the Offset is equal to a positive integer times an nth power of 2, n=max $(3, \lfloor \log_2(N_{info}) \rfloor - 6)$, the positive integer is equal to 1, 2, 3, 4, 5 or 6. In one embodiment, the positive integer is equal to 3.

In an embodiment, determining the modulation order and the target code rate from an MCS table according to the MCS field information further includes: determining the MCS table from multiple MCS tables according to higher layer signaling. The higher layer signaling may be table field signaling (MCS-Table-PDSCH). When the MCS-Table-PDSCH does not indicate '256QAM', the modulation order and the target code rate are determined in the MCS table example of the Table 1-2 according to the modulation and coding scheme field information. When the MCS-Table-PDSCH indicates '256QAM', the modulation order and the target code are determined from the MCS table example of Table 1-3 according to the MCS field information. In this embodiment, values of target code rates in the above MCS table are all greater than 1 (the code rate in channel encoding is generally not greater than 1, which has been multiplied by 1024 in the example table), so the actual target code rate value also needs to be divided by 1024. That is, in the description of the MCS table, the above target code rates are values obtained by timing 1024. As shown in Table 1-2, the target code rate corresponding to the MCS index of 0 is 120/1024.

TABLE 1-2

MCS table example

| MCS Index $I_{MCS}$ | Modulation Order $Q_m$ | Target code Rate × [1024] R | Spectral efficiency |
|---|---|---|---|
| 0 | 2 | 120 | 0.2344 |
| 1 | 2 | 157 | 0.3066 |
| 2 | 2 | 193 | 0.3770 |
| 3 | 2 | 251 | 0.4902 |
| 4 | 2 | 308 | 0.6016 |
| 5 | 2 | 379 | 0.7402 |
| 6 | 2 | 449 | 0.8770 |
| 7 | 2 | 526 | 1.0273 |
| 8 | 2 | 602 | 1.1758 |
| 9 | 2 | 679 | 1.3262 |
| 10 | 4 | 340 | 1.3281 |
| 11 | 4 | 378 | 1.4766 |
| 12 | 4 | 434 | 1.6953 |
| 13 | 4 | 490 | 1.9141 |
| 14 | 4 | 553 | 2.1602 |
| 15 | 4 | 616 | 2.4063 |
| 16 | 4 | 658 | 2.5703 |
| 17 | 6 | 438 | 2.5664 |
| 18 | 6 | 466 | 2.7305 |
| 19 | 6 | 517 | 3.0293 |
| 20 | 6 | 567 | 3.3223 |
| 21 | 6 | 616 | 3.6094 |
| 22 | 6 | 666 | 3.9023 |
| 23 | 6 | 719 | 4.2129 |
| 24 | 6 | 772 | 4.5234 |
| 25 | 6 | 822 | 4.8164 |
| 26 | 6 | 873 | 5.1152 |
| 27 | 6 | 910 | 5.3320 |
| 28 | 6 | 948 | 5.5547 |

TABLE 1-2-continued

MCS table example

| MCS Index $I_{MCS}$ | Modulation Order $Q_m$ | Target code Rate × [1024] R | Spectral efficiency |
|---|---|---|---|
| 29 | 2 | reserved | |
| 30 | 4 | reserved | |
| 31 | 6 | reserved | |

TABLE 1-3

MCS table example

| MCS Index $I_{MCS}$ | Modulation Order $Q_m$ | Target code Rate × [1024] R | Spectral efficiency |
|---|---|---|---|
| 0 | 2 | 120 | 0.2344 |
| 1 | 2 | 193 | 0.3770 |
| 2 | 2 | 308 | 0.6016 |
| 3 | 2 | 449 | 0.8770 |
| 4 | 2 | 602 | 1.1758 |
| 5 | 4 | 378 | 1.4766 |
| 6 | 4 | 434 | 1.6953 |
| 7 | 4 | 490 | 1.9141 |
| 8 | 4 | 553 | 2.1602 |
| 9 | 4 | 616 | 2.4063 |
| 10 | 4 | 658 | 2.5703 |
| 11 | 6 | 466 | 2.7305 |
| 12 | 6 | 517 | 3.0293 |
| 13 | 6 | 567 | 3.3223 |
| 14 | 6 | 616 | 3.6094 |
| 15 | 6 | 666 | 3.9023 |
| 16 | 6 | 719 | 4.2129 |
| 17 | 6 | 772 | 4.5234 |
| 18 | 6 | 822 | 4.8164 |
| 19 | 6 | 873 | 5.1152 |
| 20 | 8 | 682.5 | 5.3320 |
| 21 | 8 | 711 | 5.5547 |
| 22 | 8 | 754 | 5.8906 |
| 23 | 8 | 797 | 6.2266 |
| 24 | 8 | 841 | 6.5703 |
| 25 | 8 | 885 | 6.9141 |
| 26 | 8 | 916.5 | 7.1602 |
| 27 | 8 | 948 | 7.4063 |
| 28 | 2 | reserved | |
| 29 | 4 | reserved | |
| 30 | 6 | reserved | |
| 31 | 8 | reserved | |

Exemplary Embodiment Two

A data communication processing method, applied to a communication device or a UE, includes: receiving control information from a wireless communication node, the wireless communication node includes a base station (BS), and the control information is downlink control information (DCI). The control information at least includes: modulation and coding scheme (MCS) field information; the MCS field information is applied to determine the modulation order and the target code rate from an MCS table according to the MCS field information, calculating an intermediate number $N_{info}$ of information bits at least according to a total number of resource elements, the modulation order and the target code rate; quantizing the intermediate number $N_{info}$ of the information bits to obtain the quantized intermediate number $N'_{info}$; selecting one TBS from a one-dimensional TBS table according to the quantized intermediate number $N'_{info}$.

The UE demodulates and decodes data from the base station according to the TBS to obtain received data with a size of TBS; or performs low density parity check code (LDPC) encoding on information bits data of a length of TBS to obtain the encoded data, and sends the encoded data to the base station.

In an embodiment, determining the modulation order and the target code rate from an MCS table according to the MCS field information further includes: determining the MCS table from multiple MCS tables according to higher layer signaling. The higher layer signaling includes: but is not limited to, at least one of the following: MCS table field signaling (MCS-Table-PDSCH), target block error rate (BLER) field signaling (BLER-Target), CQI table field signaling (CQI-table).

In an embodiment, the multiple MCS tables at least includes one MCS table, where the one MCS table includes at least the following fields: an MCS index, a modulation order, and a target code rate; where a maximum target code rate among all MCSs having a modulation order of 1 in the one MCS table is equal to sum of a code rate of mother code and Δa, where Δa is a real number ranges −0.08 from 0.08. For example, see table 2-1, The code rate of the mother code is a code rate of mother code of abase graph 2 of the basic graph of the LDPC coding defined by an NR protocol, that is, the code rate of the mother code is equal to ⅕=0.2.

TABLE 2-1

MCS table example 1

| MCS Index $I_{MCS}$ | Modulation Order $Q_m$ | Target code Rate × 1024 R | Spectral efficiency |
|---|---|---|---|
| 0 | 1 | 80 | 0.0781 |
| 1 | 1 | 156 | 0.1523 |
| 2 | 2 | 120 | 0.2344 |
| 3 | 2 | 193 | 0.3770 |
| 4 | 2 | 308 | 0.6016 |
| 5 | 2 | 449 | 0.8770 |
| 6 | 2 | 602 | 1.1758 |
| 7 | 4 | 378 | 1.4766 |
| 8 | 4 | 490 | 1.9141 |
| 9 | 4 | 616 | 2.4063 |
| 10 | 6 | 466 | 2.7305 |
| 11 | 6 | 567 | 3.3223 |
| 12 | 6 | 666 | 3.9023 |
| 13 | 2 | reserved | |
| 14 | 4 | reserved | |
| 15 | 6 | reserved | |

In an embodiment, the multiple MCS tables at least includes one MCS table, where the one MCS table includes at least the following fields: an MCS index and a spectral efficiency; where a redundancy version corresponding to an MCS with the spectral efficiency less than Δs in the one MCS table is only RV0; and redundancy versions corresponding to an MCS with the spectral efficiency greater than Δs in the one MCS table are only RV0 and RV2; where Δs is a real number greater than 0.65 and less than 0.85, which is show in Table 2-2. The beneficial effect of using the MCS table designed above is that only 4-bit control signaling information may be used to include MCS level information and redundancy version information, which greatly saves resources occupied by control signaling and greatly improves communication system stability. In this embodiment, the above MCS table includes the following fields: the MCS index, the modulation order, the target code rate, the spectral efficiency, and a redundancy version (RV) index. It can be seen that an MCS index uniquely indicates a combination of the modulation order, the target code rate, the spectral efficiency, and the RV index. The corresponding modulation order, the target code rate and the RV index is able to be obtained by the MCS field information in the downlink control information (DCI).

TABLE 2-2

MCS table example 2

| MCS Index $I_{MCS}$ | Modulation Order $Q_m$ | Target code Rate × [1024] R | Spectral efficiency | Redundancy Version $rv_{idx}$ |
|---|---|---|---|---|
| 0 | 2 | 40 | 0.0781 | 0 |
| 1 | 2 | 78 | 0.1523 | 0 |
| 2 | 2 | 120 | 0.2344 | 0 |
| 3 | 2 | 193 | 0.3770 | 0 |
| 4 | 2 | 308 | 0.6016 | 0 |
| 5 | 2 | 449 | 0.8770 | 0 |
| 6 | | | | 2 |
| 7 | 4 | 378 | 1.4766 | 0 |
| 8 | | | | 2 |
| 9 | 4 | 616 | 2.4063 | 0 |
| 10 | | | | 2 |
| 11 | 6 | 567 | 3.3223 | 0 |
| 12 | | | | 2 |
| 13 | 2 | reserved | | 2 |
| 14 | 4 | reserved | | 2 |
| 15 | 6 | reserved | | 2 |

In an embodiment, multiple MCS tables includes at least one MCS table, where the one MCS table includes at least the following fields: the MCS index, the modulation order, the target code rate, and the spectral efficiency; where the MCS index in the one MCS table only indicates a redundancy version number (index) corresponding to the MCS of the modulation order (not indicating the corresponding target code rate and the spectral efficiency, or the corresponding target code rate and the spectral efficiency are reserved items). An MCS table example is as shown in Table 2-2, where the MCS indexes only indicating the modulation order are 13, 14 and 15, and the corresponding redundancy version number (index) indicated by the MCS with indexes 13, 14 and 15 is equal to 2.

In an embodiment, the multiple MCS tables at least includes one MCS table, where the one MCS table comprises at least the following fields: an MCS index and the target code rate; where in the one MCS table, a redundancy version corresponding to an MCS in which the target code rate is less than a sum of a mother code and Δb is only RV0, where Δb is a positive real number less than or equal to 0.1; and/or in the one MCS table, a redundancy version corresponding to an MCS in which the target code rate is greater than the sum of the mother code and Δb, and is less than a sum of twice of the code rate of the mother code and Δc comprises: {RV0, RV2}, where Δb is a positive real number less than or equal to 0.1, and Δc is a positive real number less than or equal to 0.1; and/or in the one MCS table, a redundancy version corresponding to an MCS in which the target code rate is greater than the sum of twice of the code rate of the mother code and Δc comprises: {RV0, RV2, RV3}, {RV0, RV2, RV1} or {RV0, RV2, RV3, RV1}, wherein Δc is a positive real number less than or equal to 0.1. For example, see table 2-1, The code rate of the mother code is a code rate of mother code of a base graph 2 of the basic graph of the LDPC coding defined by an NR protocol, that is, the code rate of the mother code is equal to ⅕=0.2.

In this embodiment, one MCS table example includes the following fields: the MCS index, the modulation order, the target code rate, the spectral efficiency, and the redundancy version (RV) number, which is shown in table 2-3.

TABLE 2-3

MCS table example 3

| MCS Index $I_{MCS}$ | Modulation Order $Q_m$ | Target code Rate × [1024] R | Spectral efficiency | Redundancy Version $rv_{idx}$ |
|---|---|---|---|---|
| 0 | 2 | 78 | 0.1523 | 0 |
| 1 | 2 | 120 | 0.2344 | 0 |
| 2 | 2 | 193 | 0.3770 | 0 |
| 3 | 2 | 308 | 0.6016 | 0 |
| 4 | | | | 2 |
| 5 | 2 | 449 | 0.8770 | 0 |
| 6 | | | | 2 |
| 7 | 2 | 602 | 1.1758 | 0 |
| 8 | | | | 2 |
| 9 | | | | 3 |
| 10 | | | | 1 |
| 11 | 4 | 378 | 1.4766 | 0 |
| 12 | | | | 2 |
| 13 | 4 | 490 | 1.9141 | 0 |
| 14 | | | | 2 |
| 15 | 4 | 616 | 2.4063 | 0 |
| 16 | | | | 2 |
| 17 | | | | 3 |
| 18 | | | | 1 |
| 19 | 6 | 466 | 2.7305 | 0 |
| 20 | | | | 2 |
| 21 | 6 | 567 | 3.3223 | 0 |
| 22 | | | | 2 |
| 23 | | | | 3 |
| 24 | | | | 1 |
| 25 | 6 | 666 | 3.9023 | 0 |
| 26 | | | | 2 |
| 27 | | | | 3 |
| 28 | | | | 1 |
| 29 | 2 | reserved | | 2 |
| 30 | 4 | reserved | | 2 |
| 31 | 6 | reserved | | 2 |

It can be seen from Table 2-3, the redundancy version of the MCS corresponding to the target code rate of {78, 120, 193}/1024 is only RV0, such as the MCS index of {0, 1, 2} in the table; since the target code rate is relatively low, the target code rate is lower than or very close to the code rate of the mother code of the code rate of the mother code (the above code rate of mother code is the base graph 2), the above code rate of mother code is equal to $\frac{1}{5}=0.2$. Moreover, the redundancy version of the MCS corresponding to the target code rate of {308, 449, 378, 490, 466}/1024 is only {RV0, RV2}. The redundancy version of the MCS corresponding to the target code rate of {602, 616, 567, 666, 466}/1024 may be {RV0, RV2}. It may be considered that the above $\Delta b$ and $\Delta c$ are equal to 0.05 and 0.06, respectively.

In an embodiment, the multiple MCS tables at least includes one MCS table, where in one MCS table, the number of MCS only supports RV0 is 3 or 4. In an embodiment, the multiple MCS tables at least includes one MCS table, where in one MCS table, the number of MCS only supports RV0 and RV2 is 4 or 5. This embodiment further provides one MCS table example, which includes the following fields: the MCS index, the modulation order, the target code rate, the spectral efficiency, and the redundancy version (RV) number, which is shown in table 2-4.

TABLE 2-4

MCS table example 4

| MCS Index $I_{MCS}$ | Modulation Order $Q_m$ | Target code Rate × [1024] R | Spectral efficiency | Redundancy Version $rv_{idx}$ |
|---|---|---|---|---|
| 0 | 2 | 40 | 0.0781 | 0 |
| 1 | 2 | 78 | 0.1523 | 0 |

TABLE 2-4-continued

MCS table example 4

| MCS Index $I_{MCS}$ | Modulation Order $Q_m$ | Target code Rate × [1024] R | Spectral efficiency | Redundancy Version $rv_{idx}$ |
|---|---|---|---|---|
| 2 | 2 | 120 | 0.2344 | 0 |
| 3 | 2 | 193 | 0.3770 | 0 |
| 4 | 2 | 308 | 0.6016 | 0 |
| 5 | | | | 2 |
| 6 | 2 | 449 | 0.8770 | 0 |
| 7 | | | | 2 |
| 8 | 2 | 602 | 1.1758 | 0 |
| 9 | | | | 2 |
| 10 | | | | 3 |
| 11 | | | | 1 |
| 12 | 4 | 378 | 1.4766 | 0 |
| 13 | | | | 2 |
| 14 | 4 | 490 | 1.9141 | 0 |
| 15 | | | | 2 |
| 16 | 4 | 616 | 2.4063 | 0 |
| 17 | | | | 2 |
| 18 | | | | 3 |
| 19 | | | | 1 |
| 20 | 6 | 466 | 2.7305 | 0 |
| 21 | | | | 2 |
| 22 | 6 | 567 | 3.3223 | 0 |
| 23 | | | | 2 |
| 24 | | | | 3 |
| 25 | 6 | 666 | 3.9023 | 0 |
| 26 | | | | 2 |
| 27 | | | | 3 |
| 28 | | | | 1 |
| 29 | 2 | reserved | | 2 |
| 30 | 4 | reserved | | 2 |
| 31 | 6 | reserved | | 2 |

In an embodiment, the multiple MCS tables at least includes one MCS table, where in one MCS table, a target code rate of MCS with an 0 index is 80/1024; and/or a target code rate of MCS with an 1 index is 156/1024. In an embodiment, the modulation order indicated by one MCS level 0 and MCS level 1 is equal to 1.

In an embodiment, determining the modulation order and the target code rate from the MCS table according to the modulation and coding scheme (MCS) field information also includes: when the target block error rate (BLER) indicated by higher layer signaling is not equal to 0.1, the modulation order, the target code rate and the redundancy version number are determined from the MCS table according to the MCS field information. This embodiment provides an MCS table, which corresponds to a maximum modulation order of 6, and is used for a signal waveform of cyclic prefix-orthogonal frequency division multiplexing (CP-OFDM), as shown in Table 2-5 or Table 2-6. An MCS table is provided for a signal waveform of transform pre-coding OFDM or discrete Fourier transform spread spectrum OFDM, which may be used for determining the modulation order and the target code rate of the PUSCH, as shown in Table 2-7 or table 2-8. MCS table examples shown in Table 2-5 and Table 2-6 correspond to a 5-bit indication, MCS table examples shown in Table 2-7 and Table 2-8 correspond to a 4-bit indication.

TABLE 2-5

MCS table example 5

| MCS Index $I_{MCS}$ | Modulation Order $Q_m$ | code rate × 1024 | efficiency |
|---|---|---|---|
| 0 | 2 | 40 | 0.0781 |
| 1 | 2 | 59 | 0.1152 |

TABLE 2-5-continued

MCS table example 5

| MCS Index $I_{MCS}$ | Modulation Order $Q_m$ | code rate × 1024 | efficiency |
|---|---|---|---|
| 2 | 2 | 78 | 0.1523 |
| 3 | 2 | 99 | 0.1934 |
| 4 | 2 | 120 | 0.2344 |
| 5 | 2 | 157 | 0.3066 |
| 6 | 2 | 193 | 0.3770 |
| 7 | 2 | 251 | 0.4902 |
| 8 | 2 | 308 | 0.6016 |
| 9 | 2 | 379 | 0.7402 |
| 10 | 2 | 449 | 0.8770 |
| 11 | 2 | 526 | 1.0273 |
| 12 | 2 | 602 | 1.1758 |
| 13 | 2 | 679 | 1.3262 |
| 14 | 4 | 340 | 1.3281 |
| 15 | 4 | 378 | 1.4766 |
| 16 | 4 | 434 | 1.6953 |
| 17 | 4 | 490 | 1.9141 |
| 18 | 4 | 553 | 2.1602 |
| 19 | 4 | 616 | 2.4063 |
| 20 | 4 | 658 | 2.5703 |
| 21 | 6 | 438 | 2.5664 |
| 22 | 6 | 466 | 2.7305 |
| 23 | 6 | 517 | 3.0293 |
| 24 | 6 | 567 | 3.3223 |
| 25 | 6 | 616 | 3.6094 |
| 26 | 6 | 666 | 3.9023 |
| 27 | reserved | reserved | reserved |
| 28 | reserved | reserved | reserved |
| 29 | 2 | | reserved |
| 30 | 4 | | |
| 31 | 6 | | |

TABLE 2-6

MCS table example 6

| MCS Index $I_{MCS}$ | Modulation Order $Q_m$ | code rate × 1024 | efficiency |
|---|---|---|---|
| 0 | 1 | 80 | 0.0781 |
| 1 | 1 | 118 | 0.1152 |
| 2 | 1 | 156 | 0.1523 |
| 3 | 1 | 198 | 0.1934 |
| 4 | 2 | 120 | 0.2344 |
| 5 | 2 | 157 | 0.3066 |
| 6 | 2 | 193 | 0.3770 |
| 7 | 2 | 251 | 0.4902 |
| 8 | 2 | 308 | 0.6016 |
| 9 | 2 | 379 | 0.7402 |
| 10 | 2 | 449 | 0.8770 |
| 11 | 2 | 526 | 1.0273 |
| 12 | 2 | 602 | 1.1758 |
| 13 | 2 | 679 | 1.3262 |
| 14 | 4 | 340 | 1.3281 |
| 15 | 4 | 378 | 1.4766 |
| 16 | 4 | 434 | 1.6953 |
| 17 | 4 | 490 | 1.9141 |
| 18 | 4 | 553 | 2.1602 |
| 19 | 4 | 616 | 2.4063 |
| 20 | 4 | 658 | 2.5703 |
| 21 | 6 | 438 | 2.5664 |
| 22 | 6 | 466 | 2.7305 |
| 23 | 6 | 517 | 3.0293 |
| 24 | 6 | 567 | 3.3223 |
| 25 | 6 | 616 | 3.6094 |
| 26 | 6 | 666 | 3.9023 |
| 27 | reserved | reserved | reserved |
| 28 | 1 | | reserved |
| 29 | 2 | | |
| 30 | 4 | | |
| 31 | 6 | | |

TABLE 2-7

MCS table example 7

| MCS Index $I_{MCS}$ | Modulation Order $Q_m$ | code rate × 1024 | efficiency |
|---|---|---|---|
| 0 | 2 | 40 | 0.0781 |
| 1 | 2 | 78 | 0.1523 |
| 2 | 2 | 120 | 0.2344 |
| 3 | 2 | 193 | 0.3770 |
| 4 | 2 | 308 | 0.6016 |
| 5 | 2 | 449 | 0.8770 |
| 6 | 2 | 602 | 1.1758 |
| 7 | 4 | 378 | 1.4766 |
| 8 | 4 | 490 | 1.9141 |
| 9 | 4 | 616 | 2.4063 |
| 10 | 6 | 466 | 2.7305 |
| 11 | 6 | 567 | 3.3223 |
| 12 | 6 | 666 | 3.9023 |
| 13 | 2 | | reserved |
| 14 | 4 | | |
| 15 | 6 | | |

TABLE 2-8

MCS table example 8

| MCS Index $I_{MCS}$ | Modulation Order $Q_m$ | code rate × 1024 | efficiency |
|---|---|---|---|
| 0 | 1 | 80 | 0.0781 |
| 1 | 1 | 156 | 0.1523 |
| 2 | 2 | 120 | 0.2344 |
| 3 | 2 | 193 | 0.3770 |
| 4 | 2 | 308 | 0.6016 |
| 5 | 2 | 449 | 0.8770 |
| 6 | 2 | 602 | 1.1758 |
| 7 | 4 | 378 | 1.4766 |
| 8 | 4 | 490 | 1.9141 |
| 9 | 4 | 616 | 2.4063 |
| 10 | 6 | 466 | 2.7305 |
| 11 | 6 | 567 | 3.3223 |
| 12 | 6 | 666 | 3.9023 |
| 13 | 2 | | reserved |
| 14 | 4 | | |
| 15 | 6 | | |

When target BLER field signaling BLER-Target indicates that the target BLER is not equal to 0.1, a first MCS table is selected from the multiple MCS tables as the MCS table, where the MCS table corresponds to the MCS table in which the target BLER is not equal to 0.1 (or is applied to an ultra reliable and low latency communication MCS table).

The modulation order and the target code rate is determined from an MCS table according to the MCS field information, an intermediate number $N_{info}$ of information bits at least is calculated according to a total number of resource elements, the modulation order and the target code rate; the intermediate number $N_{info}$ of the information bits is quantized to obtain the quantized intermediate number $N'_{info}$; one TBS from a one-dimensional TBS table is selected according to the quantized intermediate number $N'_{info}$.

In an embodiment, the first MCS table at least includes the following fields: the MCS index, the modulation order and a spectral efficiency, where the maximum target code rate of MCS having a modulation order of 1 is Se in the MCS table, Se is equal to a sum of the code rate of the mother code and ΔSe, ΔSe is a real number ranges from −0.05 and 0.03. In this embodiment, the code rate of the mother code is equal to the code rate of the mother code of the base graph 2 of the LDPC coding, which is equal to 0.2.

In an embodiment, the multiple MCS tables include: the MCS table with a maximum modulation order of 6 (corresponding to 64QAM), the MCS table with a maximum modulation order of 8 (corresponding to 256QAM), and the first MCS table. The MCS table with the maximum modulation order of 6 (corresponding to 64QAM) and the MCS table with the maximum modulation order of 8 (corresponding to 256QAM) correspond to a target BLER which is equal to 0.1, and the first MCS table corresponds to a target BLER which is not equal to 0.1. In an embodiment, the MCS table with the maximum modulation order of 6 is as shown in Table 1-2 of exemplary embodiment one, and the MCS table with the maximum modulation order of 8 is as shown in the table 1-3 in exemplary embodiment 1, the first MCS table is shown in Table 2-6. In the first MCS table, the maximum spectral efficiency of the MCS with modulation order of 1 is less than 0.20.

Figure 4A:
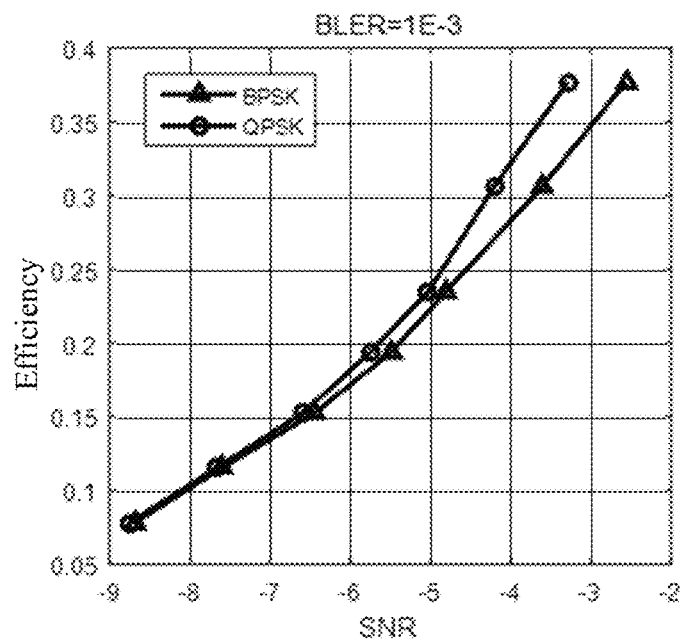
FIG. 4A is a performance diagram of a data communication processing method provided by an embodiment.
Figure 4B:
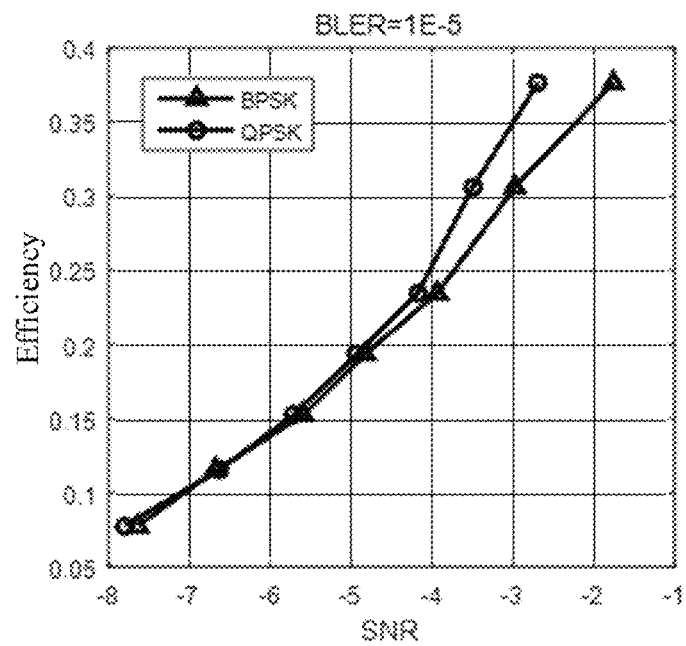
FIG. 4B is a performance diagram of another data communication processing method provided by an embodiment.

Performance diagrams shown in FIGS. 4A and 4B correspond to performance diagrams of BLER which is equal to 1E-3 (0.001) and 1E-5 (0.00001). In the above performance diagrams, the vertical ordinate is an efficiency value (corresponding to efficiency in the CQI table, corresponding to a spectral efficiency in the MCS table), and a row coordinate refers to a required signal-to-noise ratio in the corresponding BLER (FIG. 4A is 1E-3 and FIG. 4B is 1E-5). It can be seen that performance of QPSK and BPSK with the efficiency (or the spectral efficiency) below 0.2 are about the same. Because the BPSK has a better peak to average power ratio (PAPR), the BPSK has better performance coverage under the low spectrum efficiency.

This embodiment provides an MCS example, as shown in Table 2-9, the above MCS table includes the following fields: the MCS index, the modulation order, the target code rate, and the spectral efficiency; where the corresponding maximum target code rate of the MCS having the modulation order of 1 is 240/1024, and the corresponding MCS index is 4. The maximum spectral efficiency corresponding to the MCS with modulation order 1 is 0.2344. The number of MCSs with modulation order of 1 is 5. The number of MCSs having the modulation order of 1 is not limited to 4 and 5 described above, and the number of MCSs having the modulation order of 1 may be equal to 6, 7, 8, 9 or 10.

TABLE 2-9

MCS table example

| MCS Index $I_{MCS}$ | Modulation Order $Q_m$ | Target code rate × 1024 | Spectral efficiency |
|---|---|---|---|
| 0 | 1 | 80 | 0.0781 |
| 1 | 1 | 118 | 0.1152 |
| 2 | 1 | 156 | 0.1523 |
| 3 | 1 | 198 | 0.1934 |
| 4 | 1 | 240 | 0.2344 |

TABLE 2-9-continued

MCS table example

| MCS Index $I_{MCS}$ | Modulation Order $Q_m$ | Target code rate × 1024 | Spectral efficiency |
|---|---|---|---|
| 5 | 2 | 157 | 0.3066 |
| 6 | 2 | 193 | 0.3770 |
| 7 | 2 | 251 | 0.4902 |
| 8 | 2 | 308 | 0.6016 |
| 9 | 2 | 379 | 0.7402 |
| 10 | 2 | 449 | 0.8770 |
| 11 | 2 | 526 | 1.0273 |
| 12 | 2 | 602 | 1.1758 |
| 13 | 2 | 679 | 1.3262 |
| 14 | 4 | 340 | 1.3281 |
| 15 | 4 | 378 | 1.4766 |
| 16 | 4 | 434 | 1.6953 |
| 17 | 4 | 490 | 1.9141 |
| 18 | 4 | 553 | 2.1602 |
| 19 | 4 | 616 | 2.4063 |
| 20 | 4 | 658 | 2.5703 |
| 21 | 6 | 438 | 2.5664 |
| 22 | 6 | 466 | 2.7305 |
| 23 | 6 | 517 | 3.0293 |
| 24 | 6 | 567 | 3.3223 |
| 25 | 6 | 616 | 3.6094 |
| 26 | 6 | 666 | 3.9023 |
| 27 | reserved | reserved | reserved |
| 28 | 1 | reserved | |
| 29 | 2 | | |
| 30 | 4 | | |
| 31 | 6 | | |

This embodiment provides an MCS example, which is shown in Table 2-10.

TABLE 2-10

MCS table example

| MCS Index $I_{MCS}$ | Modulation Order $Q_m$ | Target code Rate × [1024] R | Spectral efficiency | Redundancy Version $rv_{idx}$ |
|---|---|---|---|---|
| 0 | 2 | 40 | 0.0781 | 0 |
| 1 | 2 | 78 | 0.1523 | 0 |
| 2 | 2 | 120 | 0.2344 | 0 |
| 3 | 2 | 193 | 0.3770 | 0 |
| 4 | 2 | 308 | 0.6016 | 0 |
| 5 | 2 | 449 | 0.8770 | 0 |
| 6 | | | | 2 |
| 7 | 4 | 378 | 1.4766 | 0 |
| 8 | | | | 2 |
| 9 | 4 | 616 | 2.4063 | 0 |
| 10 | | | | 2 |
| 11 | 6 | 567 | 3.3223 | 0 |
| 12 | | | | 2 |
| 13 | 2 | reserved | | 3 |
| 14 | 4 | reserved | | 2 |
| 15 | 6 | reserved | | 1 |

Exemplary Embodiment Three

A data communication processing method, applied to a communication device or a UE, includes: receiving control information from a wireless communication node, the wireless communication node includes a base station (BS), and the control information is downlink control information (DCI). The control information at least includes: modulation and coding scheme (MCS) field information; the MCS field information is applied to determine the modulation order and the target code rate from an MCS table according to the MCS field information, calculate an intermediate number $N_{info}$ of information bits at least according to a total number of resource elements, the modulation order and the target code rate; quantize the intermediate number $N_{info}$ of the information bits to obtain the quantized intermediate number $N'_{info}$; select one TBS from a one-dimensional TBS table according to the quantized intermediate number $N'_{info}$.

The UE demodulates and decodes data from the base station according to the TBS to obtain received data with a size of TBS; or performs low density parity check code (LDPC) encoding on information bits data of a length of TBS to obtain the encoded data, and sends the encoded data to the base station.

In an embodiment, the MCS table is as follows, an MCS table example is at least one of Table 3-1 and Table 3-2, where the MCS table at least includes an MCS having a modulation order of 1. An MCS table example 3-1 is a 5-bit (32 states, i.e., 32 MCS levels) MCS table. In the MCS table, there are 4 MCSs having the modulation order of 1. An MCS table example 3-2 is 4-bit (16 states, i.e., there are 16 MCS levels) MCS table, in the above MCS table, there are 2 MCSs having the modulation order of 1.

TABLE 3-1

MCS table example 3-1

| MCS Index $I_{MCS}$ | Modulation Order $Q_m$ | code rate × 1024 | efficiency |
|---|---|---|---|
| 0 | 1 | 80 | 0.0781 |
| 1 | 1 | 118 | Average |
| 2 | 1 | 156 | 0.1523 |
| 3 | 1 | 198 | Average |
| 4 | 2 | 120 | 0.2344 |
| 5 | 2 | 157 | Average |
| 6 | 2 | 193 | 0.3770 |
| 7 | 2 | 251 | Average |
| 8 | 2 | 308 | 0.6016 |
| 9 | 2 | 379 | Average |
| 10 | 2 | 449 | 0.8770 |
| 11 | 2 | 526 | Average |
| 12 | 2 | 602 | 1.1758 |
| 13 | 2 | 679 | Average |
| 14 | 4 | 340 | Average |
| 15 | 4 | 378 | 1.4766 |
| 16 | 4 | 434 | Average |
| 17 | 4 | 490 | 1.9141 |
| 18 | 4 | 553 | Average |
| 19 | 4 | 616 | 2.4063 |
| 20 | 4 | 658 | Average |
| 21 | 6 | 438 | Average |
| 22 | 6 | 466 | 2.7305 |
| 23 | 6 | 517 | Average |
| 24 | 6 | 567 | 3.3223 |
| 25 | 6 | 616 | Average |
| 26 | 6 | 666 | 3.9023 |
| 27 | reserved | reserved | reserved |
| 28 | 1 | | reserved |
| 29 | 2 | | |
| 30 | 4 | | |
| 31 | 6 | | |

TABLE 3-2

MCS table example 3-2

| MCS Index $I_{MCS}$ | Modulation Order $Q_m$ | code rate × 1024 | efficiency |
|---|---|---|---|
| 0 | 1 | 80 | 0.0781 |
| 1 | 1 | 156 | 0.1523 |
| 2 | 2 | 120 | 0.2344 |
| 3 | 2 | 193 | 0.3770 |
| 4 | 2 | 308 | 0.6016 |
| 5 | 2 | 449 | 0.8770 |
| 6 | 2 | 602 | 1.1758 |
| 7 | 4 | 378 | 1.4766 |
| 8 | 4 | 490 | 1.9141 |
| 9 | 4 | 616 | 2.4063 |
| 10 | 6 | 466 | 2.7305 |
| 11 | 6 | 567 | 3.3223 |
| 12 | 6 | 666 | 3.9023 |
| 13 | 2 | | reserved |
| 14 | 4 | | |
| 15 | 6 | | |

In this embodiment, the MCS table may also be described as follows. The MCS table includes at least one of the following features: the target code rate corresponding to the MCS having the modulation order of 1 in the above-mentioned MCS table at least includes one of the following values: 108, 150, 192, and 265, and at least includes one of the following values: 80, 118, 156, and 198. This embodiment provides an MCS table example as shown in Table 3-3. The MCS table at least includes an MCS having the modulation order of 1 and the maximum modulation order is 6. The maximum modulation order of the MCS table may also be equal to 4 or 8.

TABLE 3-3

MCS table example 3-3

| MCS Index $I_{MCS}$ | Modulation Order $Q_m$ | code rate × 1024 | efficiency |
|---|---|---|---|
| 0 | 1 | 80 | 0.0781 |
| 1 | 1 | 108 | 0.1055 |
| 2 | 1 | 150 | 0.1465 |
| 3 | 1 | 192 | 0.1875 |
| 4 | 2 | 54 | 0.1055 |
| 5 | 2 | 75 | 0.1465 |
| 6 | 2 | 96 | 0.1875 |
| 7 | 2 | 133 | 0.2588 |
| 8 | 2 | 169 | 0.3301 |
| 9 | 2 | 227 | 0.4424 |
| 10 | 2 | 284 | 0.5547 |
| 11 | 2 | 355 | 0.6924 |
| 12 | 2 | 425 | 0.8301 |
| 13 | 2 | 502 | 0.9795 |
| 14 | 4 | 340 | Average |
| 15 | 4 | 378 | 1.4766 |
| 16 | 4 | 434 | Average |
| 17 | 4 | 490 | 1.9141 |
| 18 | 4 | 553 | Average |
| 19 | 4 | 616 | 2.4063 |
| 20 | 4 | 658 | Average |
| 21 | 6 | 438 | Average |
| 22 | 6 | 466 | 2.7305 |
| 23 | 6 | 517 | Average |
| 24 | 6 | 567 | 3.3223 |
| 25 | 6 | 616 | Average |
| 26 | 6 | 666 | 3.9023 |
| 27 | reserved | reserved | reserved |
| 28 | 1 | | reserved |
| 29 | 2 | | |
| 30 | 4 | | |
| 31 | 6 | | |

In this embodiment, the MCS table may also be described as follows. The MCS table includes at least one of the following features: the target code rate corresponding to the MCS having the modulation order of 1 in the above-mentioned MCS table at least includes one of the following values: 60, 108, 140, 172 and 212 and at least includes one of the following values: 80, 200, 128, 154 and 40. This embodiment provides an MCS table example as shown in Table 3-4. The MCS table at least includes an MCS having the modulation order of 1 and the maximum modulation order is 4. The maximum modulation order of the MCS table may also be equal to 6 or 8.

TABLE 3-4

MCS table example 3-4

| MCS Index $I_{MCS}$ | Modulation Order $Q_m$ | code rate × 1024 | efficiency |
|---|---|---|---|
| 0 | 1 | 60 | 0.0586 |
| 1 | 1 | 80 | 0.0781 |
| 2 | 1 | 108 | 0.1055 |
| 3 | 1 | 140 | 0.1367 |
| 4 | 2 | 30 | 0.0586 |
| 5 | 2 | 40 | 0.0781 |
| 6 | 2 | 54 | 0.1055 |
| 7 | 2 | 70 | 0.1367 |
| 8 | 2 | 86 | 0.1680 |
| 9 | 2 | 106 | 0.2061 |
| 10 | 2 | 125 | 0.2441 |
| 11 | 2 | 150 | 0.2930 |
| 12 | 2 | 175 | 0.3418 |
| 13 | 2 | 206 | 0.4014 |
| 14 | 2 | 236 | 0.4609 |
| 15 | 2 | 273 | 0.5322 |
| 16 | 2 | 309 | 0.6035 |
| 17 | 2 | 350 | 0.6826 |
| 18 | 2 | 390 | 0.7617 |
| 19 | 2 | 435 | 0.8496 |
| 20 | 2 | 480 | 0.9375 |
| 21 | 2 | 528 | 1.0313 |
| 22 | 2 | 576 | 1.1250 |
| 23 | 2 | 604 | 1.1797 |
| 24 | 4 | 316 | 1.2344 |
| 25 | 4 | 351 | 1.3691 |
| 26 | 4 | 385 | 1.5039 |
| 27 | 4 | 422 | 1.6465 |
| 28 | 4 | 458 | 1.7891 |
| 29 | 2 | | |
| 30 | 4 | | |
| 31 | 6 | | |

Exemplary Embodiment Four

A data communication processing method, applied to a wireless communication node (a base station), includes: generating control information of a communication device related to a wireless communication node, the control information at least includes modulation and coding scheme (MCS) field information; the MCS field information is applied to determine the modulation order and the target code rate from an MCS table according to the MCS field information, calculate an intermediate number $N_{info}$ of information bits at least according to a total number of resource elements, the modulation order and the target code rate; quantize the intermediate number $N_{info}$ of the information bits to obtain the quantized intermediate number $N'_{info}$; select one TBS from a one-dimensional TBS table according to the quantized intermediate number $N'_{info}$.

The wireless communication node demodulates and decodes data from the communication device (or the UE) according to the TBS to obtain received data with a size of TBS; or performs low density parity check code (LDPC) encoding on information bits data of a length of TBS to obtain the encoded data, and sends the encoded data and the control information to the communication device (or the UE); or sends the control information to the communication device (or the UE).

The quantization calculation is performed on the intermediate number $N_{info}$ of the information bits to obtain the quantized intermediate number $N'_{info}$, as the quantization method described above in exemplary embodiment 1, which will not be repeated here. And in the determining the modulation order and the target code rate from the MCS table according to the MCS field information, the above MCS table is as the MCS table in exemplary embodiment 2 or exemplary embodiment 3, which will not be repeated here.

Embodiment Two

The embodiment further provides a data communication processing device. The device is used for implementing the embodiments described above and exemplary embodiments. What has been described will not be repeated. As used below, the term "module" may be software, hardware or a combination thereof capable of implementing predetermined functions. The device described below in the embodiment may be implemented by software, but implementation by hardware or by a combination of software and hardware is also possible and conceived.

Figure 5:
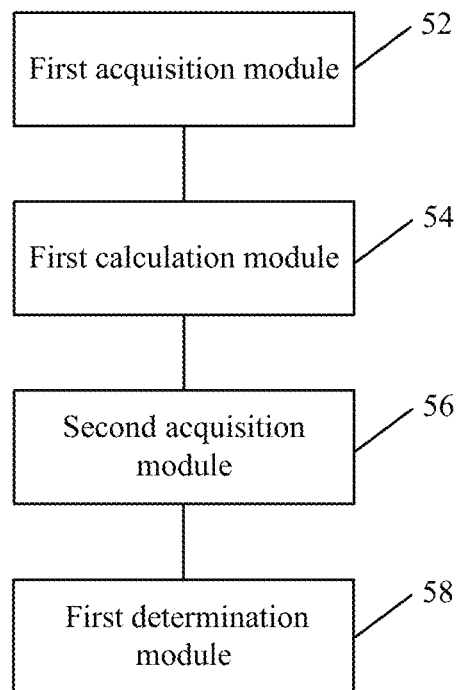
FIG. 5 is a block diagram of a data communication processing device provided by an embodiment.

FIG. 5 is a structural block diagram of a data communication processing device provided by an embodiment. As shown in FIG. 5, the device includes a first acquisition module 52, a calculation module 54, a second acquisition module 56 and a first determination module 58 described below.

1) A first acquisition module 52 is configured to acquire a modulation order and a target code rate.

2) A calculation module 54 is configure to calculate an intermediate number $N_{info}$ of information bits at least according to a total number of resource elements, the modulation order and the target code rate.

3) The second acquisition module 56 is configured to quantize the intermediate number $N_{info}$ of the information bits to obtain the quantized intermediate number $N'_{info}$.

4) The first determination module 58 is configured to determine a transport block size (TBS) according to the quantized intermediate number $N'_{info}$.

In an embodiment, the first determination module 58 is configured to select a TBS from a one-dimensional TBS table according to the quantized intermediate number $N'_{info}$.

Through the device shown in FIG. 5, the modulation order and the target code rate are acquired, the intermediate number $N_{info}$ of the information bits at least according to the total number of resource elements, the modulation order and the target code rate are calculated; the intermediate number $N_{info}$ of the information bits is quantized to obtain the quantized intermediate number $N'_{info}$; and the transport block size (TBS) is determined according to the quantized intermediate number $N'_{info}$. The problem that the communication system in the related art cannot effectively support low-latency and high-reliability communication is solved, and the technical effect of low-latency and high-reliability communication between the base station and the terminal is achieved.

In an embodiment, the first acquisition module 52 is configured to receive control information from a wireless communication node, where the control information includes at least: modulation and coding scheme (MCS)

field information; and determining the modulation order and the target code rate from the MCS table according to the MCS field information, which solves the problem that the TBS calculated at a higher MCS level in the related art leads to the actual effective code rate being greater than 0.95.

The embodiment further provides another data communication processing device. The device is configured to implement the embodiments described above and exemplary embodiments. What has been described will not be repeated. As used below, the term "module" may be software, hardware or a combination thereof capable of implementing predetermined functions. The device described below in the embodiments is implemented by software, but implementation by hardware or by a combination of software and hardware is also possible and conceived.

Figure 6:
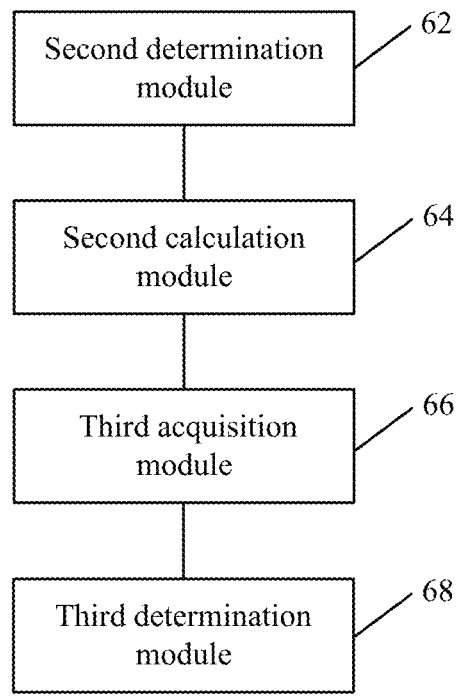
FIG. 6 is a block diagram of another data communication processing device provided by an embodiment.

FIG. 6 is a structural block diagram of another data communication processing device provided by an embodiment. The device is applied to a terminal. As shown in FIG. 6, the device includes a second determination module 62, a second calculation module 64, a third acquisition module 66 and a third determination module 68 described below.

1) The second determination module 62 is configured to determine a modulation order and a target code rate.

2) The second calculation module 64 is configure to calculate an intermediate number $N_{info}$ of information bits at least according to a total number of resource elements, the modulation order and the target code rate.

3) The third acquisition module 66 is configured to quantize the intermediate number $N_{info}$ of the information bits to obtain the quantized intermediate number $N'_{info}$.

4) The third determination module 68 is configured to determine a transport block size (TBS) according to the quantized intermediate number $N'_{info}$.

In an embodiment, the third determination module 68 is configured to select a TBS from a one-dimensional TBS table according to the quantized intermediate number $N'_{info}$.

Through FIG. 6, the modulation order and the target code rate are determined, the intermediate number $N_{info}$ of the information bits is calculated at least according to the total number of resource elements, the modulation order and the target code rate; the intermediate number $N_{info}$ of the information bits is quantized to obtain the quantized intermediate number $N'_{info}$; and the transport block size (TBS) is determined according to the quantized intermediate number $N'_{info}$. The problem that the communication system in the related art cannot effectively support low-latency and high-reliability communication is solved, and the technical effect of low-latency and high-reliability communication between the base station and the terminal is achieved.

In an embodiment, the second determination module 62 is configured to generate control information of a communication device related to a wireless communication node, where the control information at least includes: modulation and coding scheme (MCS) field information; determine the modulation order and the target code rate from an MCS table according to the MCS field information, which solves the problem that the TBS calculated at a higher MCS level in the related art leads to the actual effective code rate being greater than 0.95.

In an embodiment, the step in which the intermediate number $N_{info}$ of the information bits is quantized to obtain the quantized intermediate number $N'_{info}$ includes: quantizing the intermediate number $N_{info}$ according to the following formula:

$$N'_{info} = \max\left(24, 2^n * \left\lfloor \frac{N_{info} - \text{Offset}}{2^n} \right\rfloor\right),$$

where the Offset is determined according to the intermediate number $N_{info}$, and $n=\max(3, \lfloor \log_2(N_{info}) \rfloor - 6)$.

In an embodiment, the step in which the intermediate number $N_{info}$ of the information bits is quantized to obtain the quantized intermediate number $N'_{info}$ includes: quantizing the intermediate number $N_{info}$ according to the following formula $$N'_{info} = \max\left(24, 2^n * \left\lfloor \frac{N_{info}}{2^n} \right\rfloor\right) - \text{Offset},$$

where the Offset is determined according to the intermediate number $N_{info}$, and $n=\max(3, \lfloor \log_2(N_{info}) \rfloor - 6)$.

In an embodiment, the Offset is equal to a positive integer times an nth power of 2, $n=\max(3, \lfloor \log_2(N_{info}) \rfloor - 6)$, the positive integer is equal to 1, 2, 3, 4, 5 or 6.

In an embodiment, the step in which the intermediate number $N_{info}$ of the information bits is quantized to obtain the quantized intermediate number $N'_{info}$ includes: quantizing the intermediate number $N_{info}$ according to the following formula $$N'_{info} = \max\left(24, 2^n * \left\lfloor \frac{N_{info}}{2^n} - \alpha \right\rfloor\right) \text{ or}$$

$$N'_{info} = \max\left(24, 2^n * \left(\left\lfloor \frac{N_{info}}{2^n} \right\rfloor - \alpha\right)\right),$$

where $n=\max(3, \lfloor \log_2(N_{info}) \rfloor - 6)$, $\alpha$ is equal to 1, 2, 3, 4, 5 or 6.

In an embodiment, the intermediate number $N_{info}$ of the information bits is less than or equal to a preset threshold, where the preset threshold is equal to 3824, 3816, 3840, or 3896.

In an embodiment, the above device further includes: a table determination module, which is configured to determine the MCS table from multiple MCS tables according to higher layer signaling.

In an embodiment, the multiple MCS tables at least includes one MCS table, where the one MCS table includes at least the following fields: an MCS index, a modulation order, and a target code rate. Where a maximum target code rate among all MCSs having a modulation order of 1 in the one MCS table is equal to a sum of a code rate of mother code and Δa, where Δa is a real number ranges −0.08 from 0.08.

In an embodiment, the multiple MCS tables at least includes one MCS table, where the one MCS table includes at least the following fields: an MCS index, a modulation order, a target code rate and a spectral efficiency, where a redundancy version corresponding to an MCS with the spectral efficiency less than Δs in the one MCS table is only RV0, and redundancy versions corresponding to an MCS with the spectral efficiency greater than Δs in the one MCS table are only RV0 and RV2. Where Δs is a real number greater than 0.65 and less than 0.85.

In an embodiment, the multiple MCS tables at least includes one MCS table, where the one MCS table comprises at least the following fields: an MCS index, a modulation order, and a target code rate; where in the one MCS table, a redundancy version corresponding to an MCS in which the target code rate is less than a sum of a mother code and Δb is only RV0, where Δb is a positive real number less than or equal to 0.1.

In an embodiment, in the one MCS table, a redundancy version corresponding to an MCS in which the target code rate is greater than the sum of the mother code and Δb, and is less than a sum of twice of the code rate of the mother code and Δc includes: {RV0, RV2}, where Δb is a positive real number less than or equal to 0.1, and Δc is a positive real number less than or equal to 0.1.

In an embodiment, in the one MCS table, a redundancy version corresponding to an MCS in which the target code rate is greater than the sum of twice of the code rate of the mother code and Δc includes: {RV0, RV2, RV3}, {RV0, RV2, RV1} or {RV0, RV2, RV3, RV1}, where Δc is a positive real number less than or equal to 0.1.

In an embodiment, the code rate of the mother code is equal to 0.2.

In an embodiment, the multiple MCS tables at least includes one MCS table, where in one MCS table, the number of MCS only supports RV0 is 3 or 4.

In an embodiment, the multiple MCS tables at least includes one MCS table, where in one MCS table, the number of MCS only supports RV0 and RV2 is 4 or 5.

In an embodiment, the multiple MCS tables at least includes one MCS table, where in one MCS table, a target code rate of MCS with an 0 index is 80/1024; and/or a target code rate of MCS with an 1 index is 156/1024.

In an embodiment, the multiple MCS tables include at least one MCS table, where the one MCS table includes at least the following fields: an MCS index, the modulation order, the target code rate and a redundancy version number.

In an embodiment, the MCS table at least includes the following fields: the MCS index and the modulation order, the number of MCSs having a modulation order of 1 is 4, 5 and 6.

In an embodiment, the MCS table at least includes the following fields: the MCS index, the modulation order and the target code rate, the maximum target code rate of MCS having a modulation order of 1 is 198/1024 or 240/1024.

In an embodiment, the MCS table at least includes the following fields: the MCS index and the spectral efficiency, the maximum target code rate of MCS having a modulation order of 1 is 0.1934 or 0.2344.

The various modules described above may be implemented by software or hardware. Implementation by hardware may, but may not necessarily, be performed in the following manner: the various modules described above are located in a same processor or located in different processors in any combination form.

Embodiment Three

An embodiment of the present disclosure further provides a storage medium. The storage medium is configured to store computer programs which, when run, execute the steps of any one of the above-mentioned method embodiments.

In this embodiment, the storage medium may be configured to store computer programs for executing the following steps:
acquiring a modulation order and a target code rate; calculating an intermediate number $N_{info}$ of information bits at least according to a total number of resource elements, the modulation order and the target code rate; quantizing the intermediate number $N_{info}$ of the information bits to obtain the quantized intermediate number $N'_{info}$; determining a transport block size (TBS) according to the quantized intermediate number $N'_{info}$.

In an embodiment, the storage medium is further configured to store computer programs for executing the following steps: determining a modulation order and a target code rate; calculating an intermediate number $N_{info}$ of information bits at least according to a total number of resource elements, the modulation order and the target code rate; quantizing the intermediate number $N_{info}$ of the information bits to obtain the quantized intermediate number $N'_{info}$; and determining a transport block size (TBS) according to the quantized intermediate number $N'_{info}$.

In an embodiment, the storage medium described above may include, but is not limited to, a USB flash disk, a read-only memory (ROM), a random access memory (RAM), a mobile hard disk, a magnetic disk, an optical disk or another medium capable of storing computer programs.

An embodiment of the present disclosure further provides an electronic apparatus, including a memory and a processor, where the memory is configured to store computer programs and the processor is configured to execute the computer programs for executing the steps in any one of the method embodiments described above.

In one embodiment, the electronic device described above may further include a transmission device and an input/output device, where both the transmission device and the input/output device are connected to the processor described above.

In an embodiment, the processor may be further configured to store computer programs for executing the following steps: acquiring a modulation order and a target code rate; calculating a intermediate number $N_{info}$ of information bits at least according to a total number of resource elements, the modulation order and the target code rate; quantizing the intermediate number $N_{info}$ of the information bits to obtain the quantized intermediate number $N'_{info}$; determining a transport block size (TBS) according to the quantized intermediate number $N'_{info}$.

In an embodiment, the electronic device is further configured to store computer programs for executing the following steps: determining a modulation order and a target code rate; calculating an intermediate number $N_{info}$ of information bits at least according to a total number of resource elements, the modulation order and the target code rate; quantizing the intermediate number $N_{info}$ of the information bits to obtain the quantized intermediate number $N'_{info}$; and determining a transport block size (TBS) according to the quantized intermediate number $N'_{info}$.

For specific examples in the embodiment, reference may be made to the examples described in the embodiments and exemplary implementation modes described above, and the examples will not be repeated in the embodiment.

At least one module or at least one step of the present disclosure described in above embodiments may be implemented by a general computing apparatus, and the at least one module or at least one step described above may be concentrated on a single computing apparatus or distributed on a network composed of multiple computing apparatuses.

In an embodiment, at least one module or at least one step may be implemented by program codes executable by the computing apparatuses, so that they may be stored in a storage apparatus to be executed by the computing apparatuses. In some circumstances, the illustrated or described steps may be executed in sequences different from those described herein, or the at least one module or at least one step may be separately made into at least one integrated circuit module, or multiple modules or steps therein may be made into a single integrated circuit module for implementation. In this way, the present disclosure is not limited to any specific combination of hardware and software.

What is claimed is:

1. A data communication processing method, applied to a communication device, comprising:
  acquiring a modulation order and a target code rate;
  calculating an intermediate number $N_{info}$ of information bits according to a total number of resource elements, the modulation order and the target code rate; and
  quantizing the intermediate number $N_{info}$ of the information bits to obtain a quantized intermediate number $N'_{info}$; and
  determining a transport block size, TBS, according to the quantized intermediate number $N'_{info}$, wherein the acquiring the modulation order and the target code rate comprises:
  receiving control information from a wireless communication node, wherein the control information comprises: modulation and coding scheme, MCS, field information; and
  determining the modulation order and the target code rate from an MCS table according to the MCS field information;
  wherein the MCS table comprises the following fields: an MCS index, the modulation order and the target code rate;
  wherein a maximum target code rate corresponding to the MCS having a modulation order of 1 is a ratio of 198 to 1024.

2. The method of claim 1, further comprising:
  determining the MCS table from a plurality of MCS tables according to higher layer signaling.

3. The method of claim 2, wherein the plurality of MCS tables at least comprises one MCS table, wherein the one MCS table comprises at least the following fields: an MCS index, a modulation order, and a target code rate;
  wherein a maximum target code rate among all MCSs having a modulation order of 1 in the one MCS table is equal to a sum of a code rate of a mother code and $\Delta a$, wherein $\Delta a$ is a real number greater than $-0.08$ and less than 0.08, and
  wherein the code rate of the mother code is equal to 0.2.

4. A data communication processing method, applied to a radio communication node, comprising:
  determining a modulation order and a target code rate;
  calculating an intermediate number $N_{info}$ of information bits according to a total number of resource elements, the modulation order and the target code rate;
  quantizing the intermediate number $N_{info}$ of the information bits to obtain a quantized intermediate number $N'_{info}$; and
  determining a transport block size, TBS, according to the quantized intermediate number $N'_{info}$, wherein the determining the modulation order and the target code rate comprises:
  generating control information of a communication device related to a wireless communication node, wherein the control information comprises:
  modulation and coding scheme, MCS, field information; and
  determining the modulation order and the target code rate from an MCS table according to the MCS field information;
  wherein the MCS table comprises at least the following fields: an MCS index, the modulation order and the target code rate;
  wherein a maximum target code rate corresponding to the MCS having a modulation order of 1 is a ratio of 198 to 1024.

5. The method of claim 4, further comprising:
  determining the MCS table from a plurality of MCS tables according to higher layer signaling.

6. The method of claim 5, wherein the plurality of MCS tables at least comprises one MCS table, wherein the one MCS table comprises at least the following fields: an MCS index, a modulation order, and a target code rate;
  wherein a maximum target code rate among all MCSs having a modulation order of 1 in the one MCS table is equal to a sum of a code rate of mother code and $\Delta a$, wherein $\Delta a$ is a real number ranges $-0.08$ from 0.08, and
  wherein the code rate of the mother code is equal to 0.2.

7. An electronic apparatus, comprising a processor, wherein the processor is configured to perform:
  acquiring a modulation order and a target code rate;
  calculating an intermediate number $N_{info}$ of information bits according to a total number of resource elements, the modulation order and the target code rate; and
  quantizing the intermediate number $N_{info}$ of the information bits to obtain a quantized intermediate number $N'_{info}$; and
  determining a transport block size, TBS, according to the quantized intermediate number $N'_{info}$, wherein the processor is configured to perform acquiring the modulation order and the target code rate, by performing:
  receiving control information from a wireless communication node, wherein the control information comprises: modulation and coding scheme, MCS, field information; and
  determining the modulation order and the target code rate from an MCS table according to the MCS field information;
  wherein the MCS table comprises the following fields: an MCS index, the modulation order and the target code rate;
  wherein a maximum target code rate corresponding to the MCS having a modulation order of 1 is a ratio of 198 to 1024.

8. The electronic apparatus of claim 7, wherein the processor is configured to perform:
  determining the MCS table from a plurality of MCS tables according to higher layer signaling.

9. The electronic apparatus of claim 8, wherein the plurality of MCS tables at least comprises one MCS table, wherein the one MCS table comprises at least the following fields: an MCS index, a modulation order, and a target code rate;
  wherein a maximum target code rate among all MCSs having a modulation order of 1 in the one MCS table is equal to a sum of a code rate of a mother code and $\Delta a$, wherein $\Delta a$ is a real number greater than $-0.08$ and less than 0.08, and wherein the code rate of the mother code is equal to 0.2.

10. An electronic apparatus, comprising a processor, wherein the processor is configured to perform:
  determining a modulation order and a target code rate;
  calculating an intermediate number $N_{info}$ of information bits according to a total number of resource elements, the modulation order and the target code rate;

quantizing the intermediate number $N_{info}$ of the information bits to obtain a quantized intermediate number $N'_{info}$; and determining a transport block size, TBS, according to the quantized intermediate number $N'_{info}$, wherein the processor is configured to perform determining the modulation order and the target code rate, by performing:

generating control information of a communication device related to a wireless communication node, wherein the control information comprises:

modulation and coding scheme, MCS, field information;

determining the modulation order and the target code rate from an MCS table according to the MCS field information;

wherein the MCS table comprises at least the following fields: an MCS index, the modulation order and the target code rate;

wherein a maximum target code rate corresponding to the MCS having a modulation order of 1 is a ratio of 198 to 1024.

11. The electronic apparatus of claim 10, wherein the processor is configured to perform:

determining the MCS table from a plurality of MCS tables according to higher layer signaling.

12. The electronic apparatus of claim 11, wherein the plurality of MCS tables at least comprises one MCS table, wherein the one MCS table comprises at least the following fields: an MCS index, a modulation order, and a target code rate;

wherein a maximum target code rate among all MCSs having a modulation order of 1 in the one MCS table is equal to a sum of a code rate of mother code and $\Delta a$, wherein $\Delta a$ is a real number ranges −0.08 from 0.08, and wherein the code rate of the mother code is equal to 0.2.

* * * * *

UNITED STATES PATENT AND TRADEMARK OFFICE
CERTIFICATE OF CORRECTION

| | | |
|---|---|---|
| PATENT NO. | : 11,522,633 B2 | Page 1 of 1 |
| APPLICATION NO. | : 16/989761 | |
| DATED | : December 6, 2022 | |
| INVENTOR(S) | : Liguang Li et al. | |

It is certified that error appears in the above-identified patent and that said Letters Patent is hereby corrected as shown below:

On the Title Page

Item (63), "Continuation of application No._PCT/CN2019/074813, filed on Feb. 15, 2019." should read --Continuation of application No. PCT/CN2019/074813, filed on Feb. 12, 2019.--.

In the Claims

Column 39, Claim 1, Lines 31-32, "the MCS" should read --an MCS--.

Column 40, Claim 4, Line 5, "the MCS" should read --an MCS--.

Column 40, Claim 7, Line 45, "the MCS" should read --an MCS--.

Column 42, Claim 10, Line 2, "the MCS" should read --an MCS--.

Signed and Sealed this
Fifteenth Day of August, 2023

Katherine Kelly Vidal
*Director of the United States Patent and Trademark Office*